United States Patent
Cohen et al.

(10) Patent No.: US 8,994,126 B2
(45) Date of Patent: Mar. 31, 2015

(54) MICROELECTROMECHANICAL SYSTEM AND METHOD

(71) Applicant: Audio Pixels Ltd, Rehovot (IL)

(72) Inventors: Yuval Cohen, Rehovot (IL); Shay Kaplan, Givat Ela (IL)

(73) Assignee: Audio Pixels Ltd (IL)

( * ) Notice: Subject to any disclaimer, the term of this patent is extended or adjusted under 35 U.S.C. 154(b) by 23 days.

(21) Appl. No.: 13/834,026

(22) Filed: Mar. 15, 2013

(65) Prior Publication Data

US 2014/0264646 A1  Sep. 18, 2014

(51) Int. Cl.
- *H01L 29/84* (2006.01)
- *B81B 3/00* (2006.01)
- *B81C 1/00* (2006.01)

(52) U.S. Cl.
CPC ........... *B81B 3/0018* (2013.01); *B81C 1/00134* (2013.01); *B81B 3/0051* (2013.01); *B81B 3/0086* (2013.01); *B81B 2201/0257* (2013.01)
USPC ........................................................ 257/415

(58) Field of Classification Search
CPC .............................................. H01I 2924/1461
USPC ........................................................ 257/415
See application file for complete search history.

(56) References Cited

U.S. PATENT DOCUMENTS

| | | | |
|---|---|---|---|
| 6,608,268 B1 * | 8/2003 | Goldsmith | 200/181 |
| 2003/0146079 A1 * | 8/2003 | Goldsmith | 200/181 |
| 2006/0276015 A1 * | 12/2006 | Morris | 438/542 |
| 2009/0001845 A1 * | 1/2009 | Ikehashi | 310/300 |
| 2012/0187530 A1 * | 7/2012 | Zhang et al. | 257/531 |
| 2012/0217609 A1 * | 8/2012 | Tanabe | 257/470 |
| 2012/0262026 A1 * | 10/2012 | Lin et al. | 310/300 |

OTHER PUBLICATIONS

International Search Report for corresponding application PCT/IL2014/050258 filed Mar. 12, 2014; Mail date Aug. 12, 2014.

* cited by examiner

*Primary Examiner* — Bilkis Jahan
(74) *Attorney, Agent, or Firm* — Cantor Colburn LLP

(57) ABSTRACT

A microelectromechanical system, including a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface, wherein a minimal distance between a first projection of a first contact area of the insulating separating member and a second projection of a second contact area of the insulating separating member is larger than a minimal separation maintained by the insulating separating member between the first element and the second element.

19 Claims, 16 Drawing Sheets

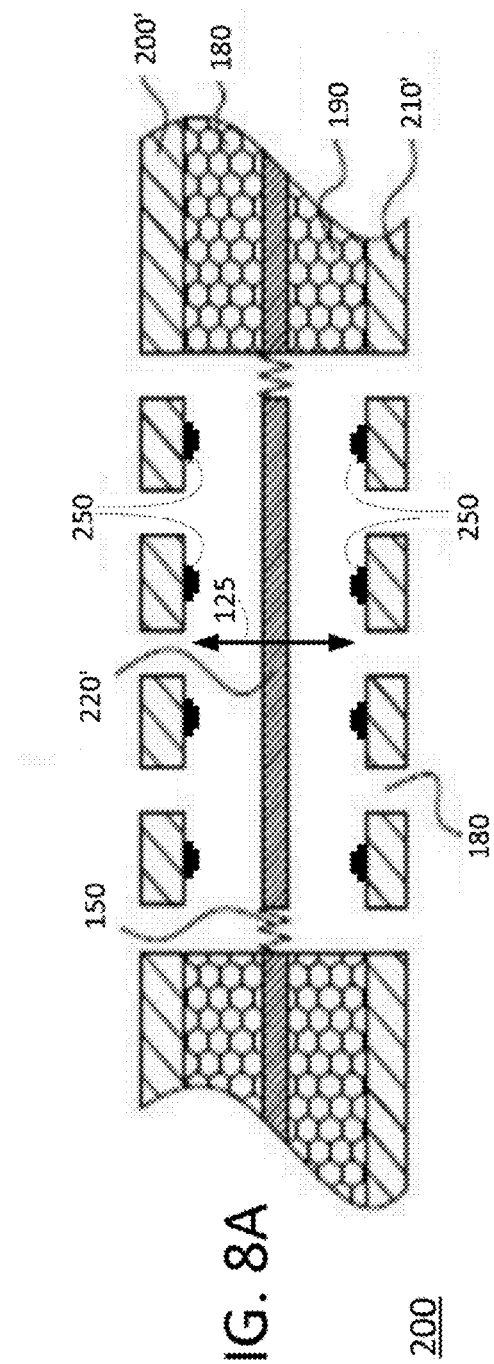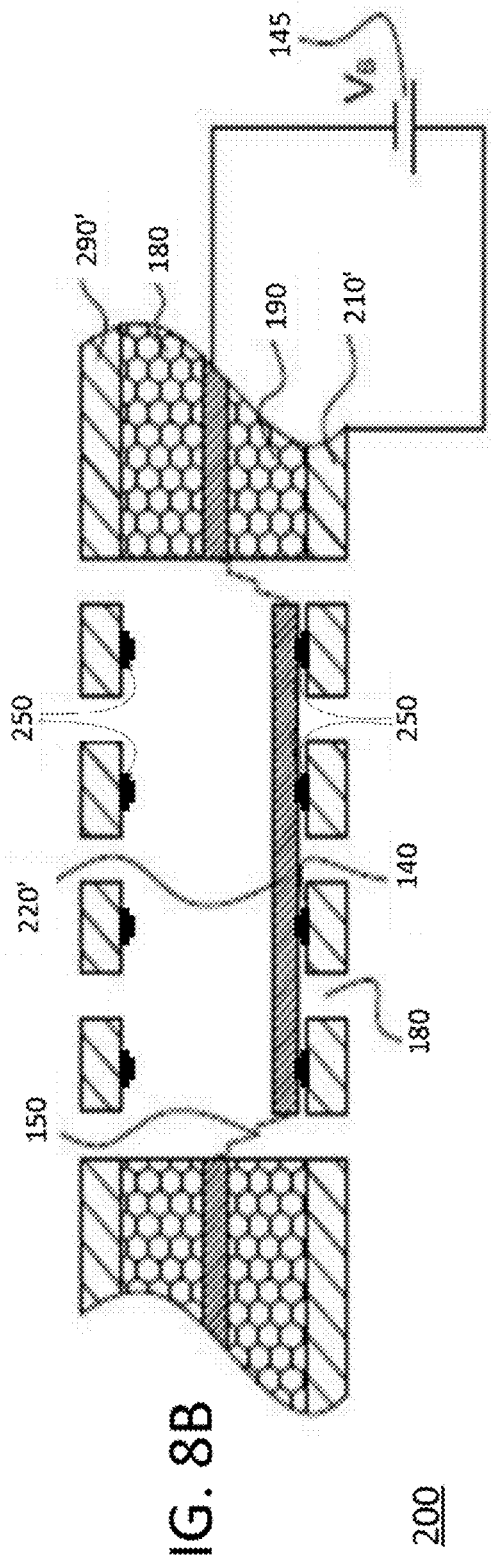

510 generating at least a part of CAD data 511 estimating an estimated runtime electrical field in a vicinity of the separating member 512 computing design dimensions of the insulating separating member in response to the estimated runtime electrical field and to an estimated electrical breakdown voltage in the vicinity of the separating member 520 obtaining a substrate 530 deposing a plurality of material layers onto the substrate, thereby generating a microelectromechanical system which includes a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface; wherein the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a minimal separation maintained by the insulating separating member between the first element and the second element.

500     FIG. 10

MICROELECTROMECHANICAL SYSTEM AND METHOD

FIELD

This invention relates to microelectromechanical systems and for methods for fabrication and design thereof.

BACKGROUND

Microelectromechanical systems (MEMS) are very small devices, which are made up of components whose size is in the micrometer scale (e.g. between 0.1 to 100 micrometers in size). MEMS devices generally range in size from 20 to 5,000 micrometers. MEMS include components that interact with the environment of the MEMS such as microsensors or actuators. At the smaller size scales, the standard constructs of classical physics are not always useful.

For example, at large scale implementations (not MEMS) the generally accepted value of the breakdown field strength of air is E≈3 MV/m (≈3 V/μm). At smaller distances, the breakdown voltage depends on gap and pressure. For example, at a pressure of 1 Atmosphere, the minimum breakdown voltage of air over a gap of 7.5 μm is approximately 327V (E=44V/um). At very small gaps (e.g. 0.5 μm), the break down voltage is larger than 2000V (E>4000V/μm).

Due to this fact, relatively small potential differences (e.g. <500V) between any two conductors in a MEMS that may come sufficiently near one another may result in a breakdown of the separating medium between such two conductors. Such breakdown may result in temporary or even permanent damage to the MEMS (e.g. due to high temperature which may result from such a breakdown).

There is therefore a need for microelectromechanical systems whose design overcomes the generation of such electric breakdowns. There is also a need for methods of fabrication and design of such MEMS.

GENERAL DESCRIPTION

In accordance with an aspect of the presently disclosed subject matter, there is provided a microelectromechanical system, including:

a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface, wherein: the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a minimal separation maintained by the insulating separating member between the first element and the second element.

In accordance with an embodiment of the presently disclosed subject matter, there is further provided a microelectromechanical system, wherein along at least a portion of the circumference of the first contact area there is a notch between the insulating separating member and the first surface in which prevails an internal electric field whose intensity is at least two times larger than an intensity of an external electric field adjacent to the notch; wherein the minimal distance keeps the internal electric field below an electrical breakdown voltage of a medium which is included in the notch.

In accordance with an embodiment of the presently disclosed subject matter, there is yet further provided a microelectromechanical system, wherein the first element is a planar member, wherein the second element is a moving member which is operable to constrainedly move nearer and farther from the planar member in response to a controlled temporal sequence of potential differences between the planar member and the moving member; and wherein the controlled temporal sequence of potential differences is controlled by an external controller in response to a signal inputted to the controller.

In accordance with an embodiment of the presently disclosed subject matter, there is yet further provided a micro electromechanical system, wherein the insulating separating member includes a first separator part whose convex envelope is substantially prismatic, and a second separator part whose convex envelope is substantially prismatic, the first separator part and the second separator part combinedly including at least 85% of a totality of insulating solid matter of the separating member; wherein for each direction parallel to the reference plane, a first length is defined as a largest length of a cross section of the first separator part along the direction, and a second length is defined as a largest length of a cross section of the second separator part along the direction; wherein the larger of the first length and the second length is larger than the minimal separation maintained by the insulating separating member between the first element and the second element.

In accordance with an embodiment of the presently disclosed subject matter, there is yet further provided a micro electromechanical system, wherein the insulating separating member is a unified separating member which includes the first contact area and the second contact area; wherein the second contact area is operable to be separated from the second surface as a result of a relative movement of the second element farther from the first element.

In accordance with an embodiment of the presently disclosed subject matter, there is yet further provided a micro electromechanical system, wherein the insulating separating member includes: a first separator section which includes the first contact area, and a second separator section which includes the second contact area which connects the second separator section to the second surface; wherein the second separator section is operable to be separated from the first separator section as a result of a relative movement of the second element farther from the first element.

In accordance with an embodiment of the presently disclosed subject matter, there is yet further provided a microelectromechanical system, wherein a hardness of the insulating separating member is larger than a hardness of the first element and of the second element, thereby serving as wear protection for the second element.

In accordance with an embodiment of the presently disclosed subject matter, there is yet further provided a microelectromechanical system, wherein a hardness of the insulating separating member is larger than a hardness of the first element and of the second element, wherein the second separator section attenuates collision impact resulting from a relative movement of the second element towards the first element, thereby serving as wear protection for the second element.

In accordance with an embodiment of the presently disclosed subject matter, there is yet further provided a microelectromechanical system, wherein the first separator section is at least partially included in a recess in the first element so that no part of the first separator section extends outside the recess to a height which is larger than a third of a total height of the first separator section.

In accordance with an embodiment of the presently disclosed subject matter, there is yet further provided a microelectromechanical system 8, wherein the first separator section is larger than the first separator section.

In accordance with an embodiment of the presently disclosed subject matter, there is yet further provided a microelectromechanical system, including a separating member which includes the insulating separating member and a part of the first element which extends from a surface plane of the first element towards the second conductive surface.

In accordance with an aspect of the presently disclosed subject matter, there is yet further provided a microelectromechanical system, including: (a) a first element and a second element, the first element having a first conductive surface facing a second conductive surface of the second element; wherein at least one of the first element and the second element is operable to constrainedly move nearer and farther from the other element; and (b) at least one insulating separating member which is operable to mechanically maintain a separation between the first surface and the second surface; wherein the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than 0.2 µm.

In accordance with an embodiment of the presently disclosed subject matter, there is yet further provided a micro electromechanical system, wherein the insulating separating member includes: a first separator section which includes the first contact area, and a second separator section which includes the second contact area which connects the second part of the insulating separating member to the second surface; wherein the second separator section is operable to be separated from the first separator section as a result of a relative movement of the second element farther from the first element.

In accordance with an embodiment of the presently disclosed subject matter, there is yet further provided a microelectromechanical system, wherein the first separator section is at least partially included in a recess in the first element so that no part of the first separator section extends outside the recess to a height which is larger than a third of a total height of the first separator section.

In accordance with an aspect of the presently disclosed subject matter, there is yet further provided a microelectromechanical system, including: (a) a first element and a second element, the first element having a first conductive surface facing a second conductive surface of the second element; wherein at least one of the first element and the second element is operable to constrainedly move nearer and farther from the other element; and (b) at least one insulating separating member which is operable to mechanically maintain a separation between the first surface and the second surface; wherein the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a manufacturing accuracy of the separating member.

In accordance with an embodiment of the presently disclosed subject matter, there is yet further provided a microelectromechanical system, wherein the microelectromechanical system is fabricated as one out of a plurality of similar microelectromechanical systems on a batch of one or more wafers, each of the plurality of the similar microelectromechanical systems having an insulating separating member in a similar location with respect to the respective microelectromechanical system, the insulating separating member including a second contact area having a largest dimension; wherein the manufacturing accuracy is defined as a smallest threshold which is larger than 95% of the largest dimensions of the second contact areas.

In accordance with an embodiment of the presently disclosed subject matter, there is yet further provided a micro electromechanical system, wherein the insulating separating member includes: a first separator section which includes the first contact area, and a second separator section which includes the second contact area which connects the second part of the insulating separating member to the second surface; wherein the second separator section is operable to be separated from the first separator section as a result of a relative movement of the second element farther from the first element.

In accordance with an aspect of the presently disclosed subject matter, there is yet further provided a method for fabrication of a microelectromechanical system, the method including: obtaining a semiconductor substrate; and depositing a plurality of material layers onto the substrate, thereby generating the microelectromechanical system which includes a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface; wherein the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a minimal separation maintained by the insulating separating member between the first element and the second element.

In accordance with an embodiment of the presently disclosed subject matter, there is yet further provided a method, wherein the deposing is based on computer-assisted design (CAD) data, wherein the deposing is preceded by generating at least a part of the CAD data, wherein the generating includes estimating an estimated runtime electrical field in a vicinity of the separating member, and computing design dimensions of the insulating separating member in response to the estimated runtime electrical field and to an estimated electrical breakdown voltage in the vicinity of the separating member.

In accordance with an embodiment of the presently disclosed subject matter, there is yet further provided a method, wherein the computing includes: (a) based on design data for the first element and for the second element, determining minimal required distance along a design reference plane between projections of a first designed contact area and of a second designed contact area in response to the estimated electrical breakdown voltage in the vicinity of the separating member; so that the estimated runtime electrical field would be smaller than the estimated electrical breakdown voltage; (b) obtaining manufacturing accuracy estimation for the fabrication of the microelectromechanical system; (c) determining a minimal post-manufacturing distance in response to the minimal required distance and to the manufacturing accuracy estimation; and (d) computing design dimensions for the first contact area and for the first contact area based on the minimal post-manufacturing distance.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 8A and 8B are cross-sectional views illustrating a part of an example of an microelectromechanical system, in accordance with the presently disclosed subject matter;

FIG. 10 is a flow chart illustrating an example of a method, in accordance with the presently disclosed subject matter.

Figure 1A:
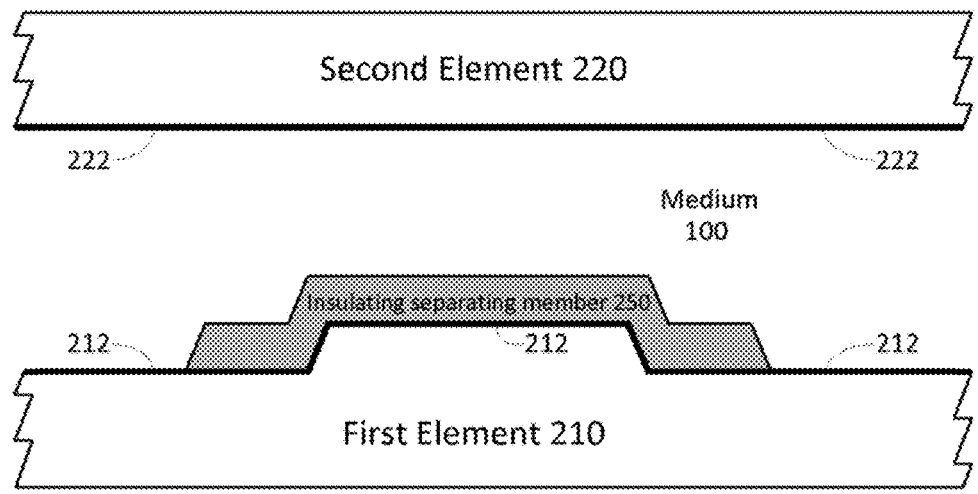
FIGS. 1A and 1B are cross-sectional views illustrating a part of an example of an microelectromechanical system, in accordance with the presently disclosed subject matter.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as, "calculating", "computing", "determining", "defining", or the like, include actions and/or processes of a computer that manipulate and/or transform data into other data, said data represented as physical quantities, e.g. such as electronic quantities, and/or said data representing the physical objects. The terms "computer", "processor", and "controller" should be expansively construed to cover any kind of electronic device with data processing capabilities, including, by way of non-limiting example, a personal computer, a server, a computing system, a communication device, a processor (e.g. digital signal processor (DSP), a microcontroller, a field programmable gate array (FPGA), an application specific integrated circuit (ASIC), etc.), any other electronic computing device, and or any combination thereof.

The operations in accordance with the teachings herein may be performed by a computer specially constructed for the desired purposes or by a general purpose computer specially configured for the desired purpose by a computer program stored in a computer readable storage medium.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment (s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

In embodiments of the presently disclosed subject matter one or more stages illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Figure 1B:
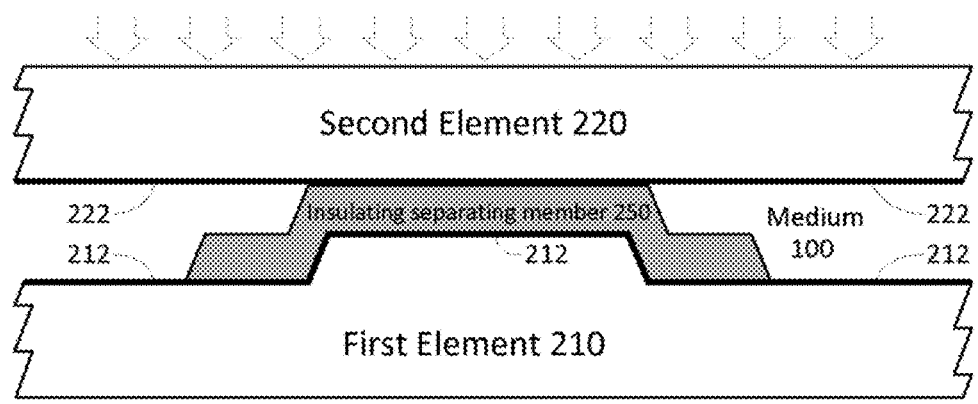

FIGS. 1A and 1B are cross-sectional views illustrating a part of an example of microelectromechanical system 200, in accordance with the presently disclosed subject matter. It is noted that while system 200 is also referred to as "microelectromechanical system 200", system 200 may also be implemented on a smaller scale- e.g. on a nanometric scale. The use of the term "microelectromechanical" is used as a matter of convenience, and is not intended to exclude systems of smaller scale. It is noted that while different examples (e.g. optional materials for different components) are provided with respect to MEMS, other materials, fabrications techniques etc. may be used for smaller systems (e.g. Nanoelectromechanical systems- NEMS), and these are also included within the scope of the present invention.

Microelectromechanical system 200 includes first element 210 and second element 220. First element 210 has a first conductive surface 212 which is facing a second conductive surface 222 of second element 220. It is noted that first element 210 may have a conductive portion which extends beyond the first conductive surface (and even may be entirely conductive), but this is not necessarily so. The thickness of the conductive part of the first element 210 below the surface may vary. Similar variations are applicable for second element 220, with respect to second conductive surface 222. It is noted that first element 210 and second element 220 may have various kinds of functions within MEMS 200. For example, any of first element 210 and/or second element 220 may serve as an electrode, as a capacitor plate, as an electrical conductor and so on.

The term "conductive" is well accepted in the art, and should be construed in a non-limiting way to refer to objects or to types of material which permit the flow of electric charges in one or more directions. For example, conductive surfaces 212 and 222 (and other conductive parts of elements 210 and 220, if any) may be fabricated from one or more electrically conductive materials such as the ones ordinarily used in the semiconductor industry.

The term "insulating" is well accepted in the art, and should be construed in a non-limiting way to refer to objects or to types of material whose internal electric charges do not flow freely, and which therefore do not conduct an electric current, under the influence of an electric field (or, in practice, conduct which may conduct only a negligible current under the influence of such an electric field). For example, insulating separating member 250 (and insulating parts of elements 210 and 220, if any) may be fabricated from at least one electrically insulating material selected from the group consisting of: silicon dioxide and silicon nitride.

If an element out of elements 210 and 220 includes a insulating part whose exterior (or part thereof) is covered by a conductive material (forming a conductive surface), this element may be made of, for example, dielectric material which is coated with one or more conductive materials such as the ones ordinarily used in the semiconductor industry.

The gap between first element 210 and second element 220 conveniently contains a dielectric (or otherwise insulating) medium (generally denoted medium 100), or vacuum. For example, in addition to one or more insulating separating members, the gap between these elements may contain one or more dielectric gases, such as air. This dielectric gas conveniently has high dielectric strength and high thermal stability in relation to the materials of which elements 210 and 220 are made. Dielectric liquids may also be used as a medium.

At least one of first element 210 and second element 220 is operable to constrainedly move nearer and farther from the other element (i.e. first element 210 may be operable to constrainedly move nearer and farther from second element 220, and/or second element 220 may be operable to constrainedly move nearer and farther from first element 210). This constrained movement may also include movement with respect to MEMS 200 as a whole (e.g. with respect to its center of mass, to an anchor location etc.), and/or with respect to a larger system within which MEMS 200 is installed and/or integrated.

The constrained movement of at least one of first element 210 and second element 220 results in relative movement of second surface 222 nearer and farther from first surface 212.

FIG. 1A exemplifies a state in which first surface 212 and second surface 222 are relatively far from one another, and FIG. 1B illustrates a state in which these surfaces are relatively close to one another. The dotted arrows in FIG. 1B illustrate the movement of first element 210 towards second element 220 in the illustrated example. It is noted that the relative movement between elements 210 and 220 is not necessarily a direct movement (i.e. one which would change the distance between these elements in the fastest way, e.g. perpendicularly to one another), but may also include diagonal and/or curved movement between these two elements. Furthermore, it is noted that elements 210 and 220 may also bend and curve under various forces (e.g. mechanical and/or electrical).

One or more mechanical separating members are fabricated between first surface 212 and second surface 222 in order to prevent the two surfaces to come too close to each other (e.g. in order to avoid short circuits, stiction or control dumping).

MEMS 220 includes at least one insulating separating member 250 which is operable to mechanically maintain a separation between the first surface 212 and the second surface 222. The insulating separating member 250 mechanically prevents first element 210 and second element 220 to come closer to each other than a maintained separation distance, by applying mechanical forces against these two elements.

Figure 4A:
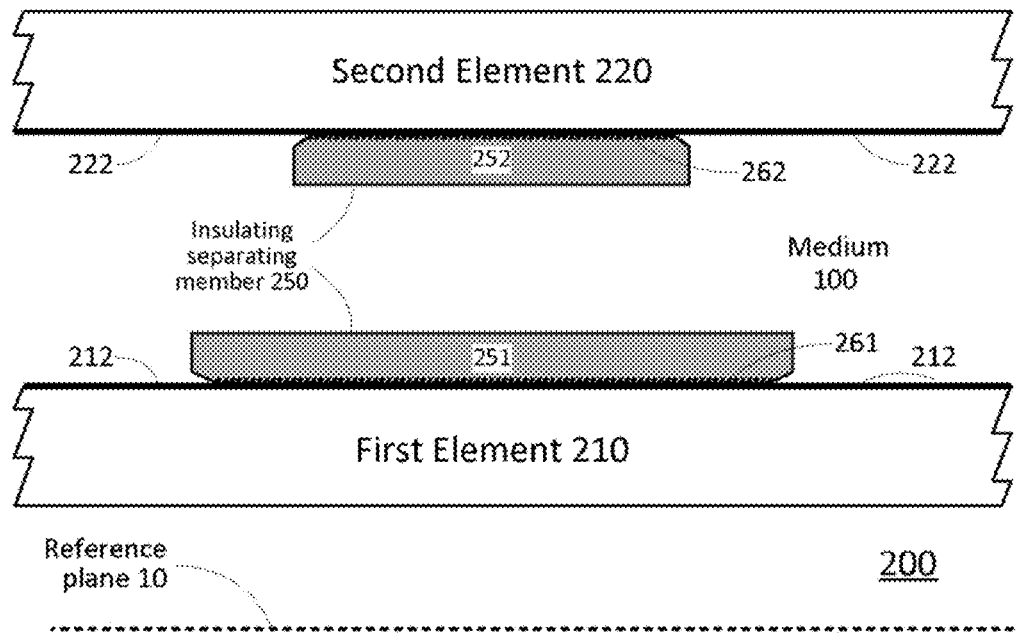
FIGS. 4A and 4B are cross-sectional views illustrating a part of an example of an microelectromechanical system, in accordance with the presently disclosed subject matter.
Figure 4B:
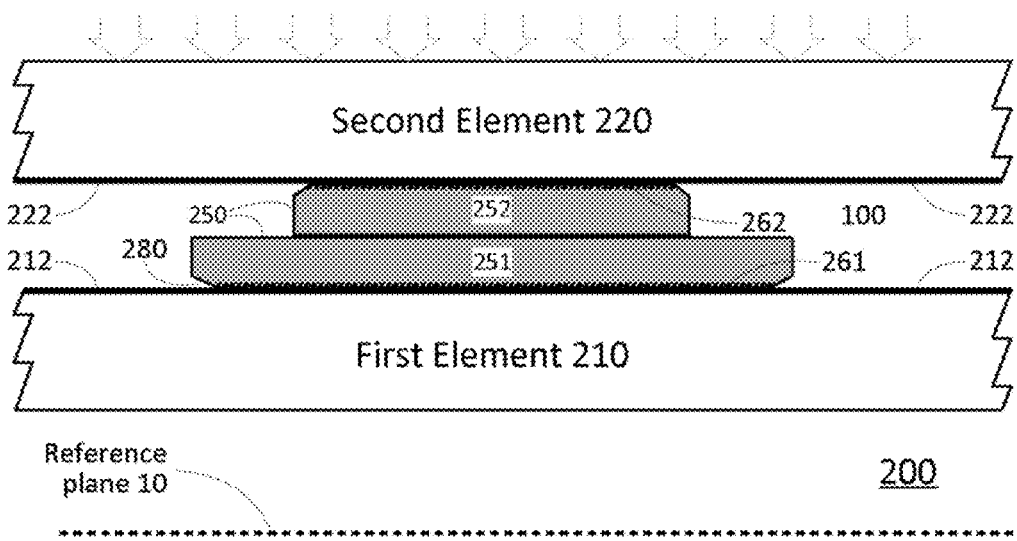

The insulating separating member 250 includes first contact area 261 which connects with first surface 212 (of first element 210), and second contact area 262 which contacts with second surface 222 (of second element 220) at least when first element 210 and second element 220 are nearest to one another (as exemplified in FIG. 1B). It is noted that optionally, second contact area 262 may connect with second surface 222 (of second element 220), e.g. as illustrated in FIGS. 4A and 4B.

Figure 1C:
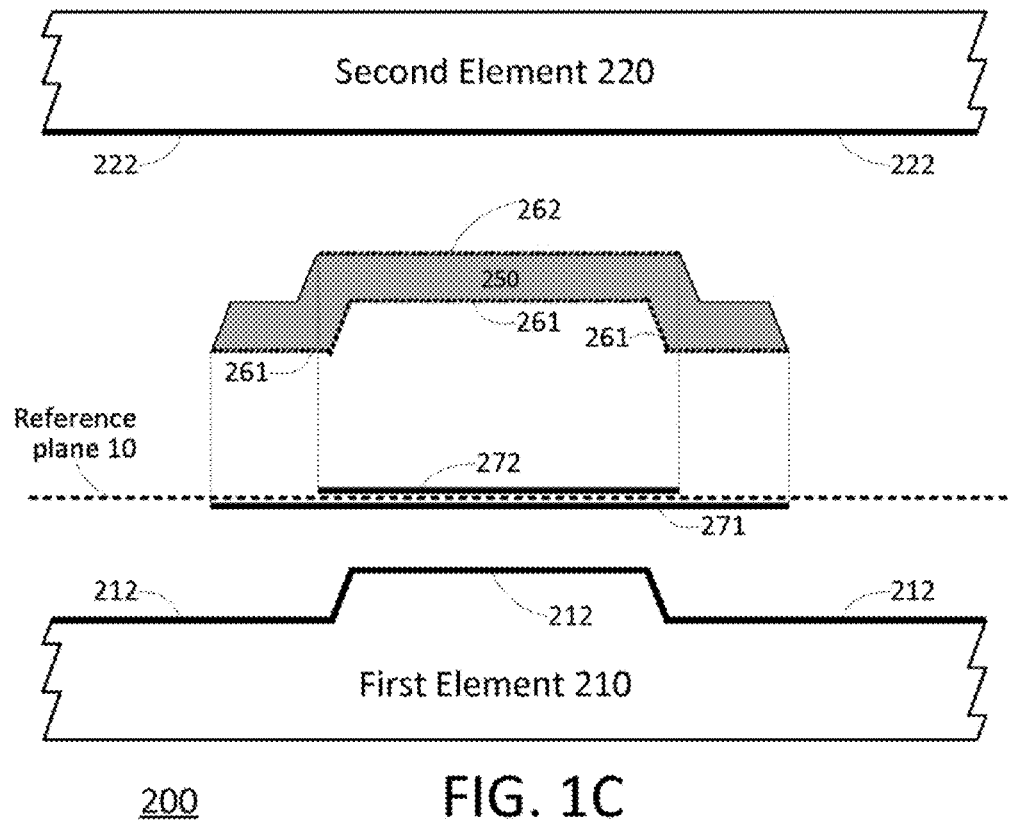
FIG. 1C is an exploded view of FIG. 1B.
Figure 1E:
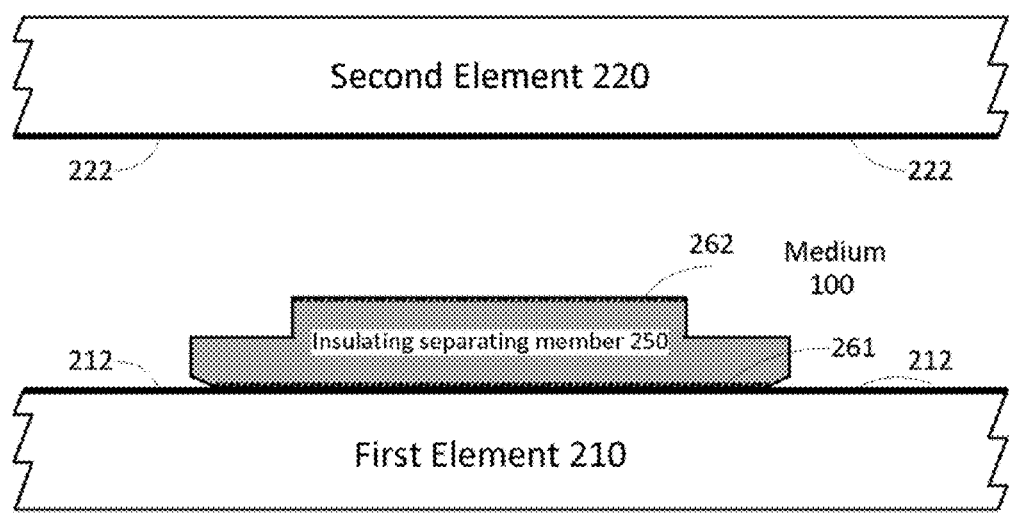
FIG. 1E is a cross-sectional view illustrating a part of an example of an microelectromechanical system, in accordance with the presently disclosed subject matter.
Figure 1D:
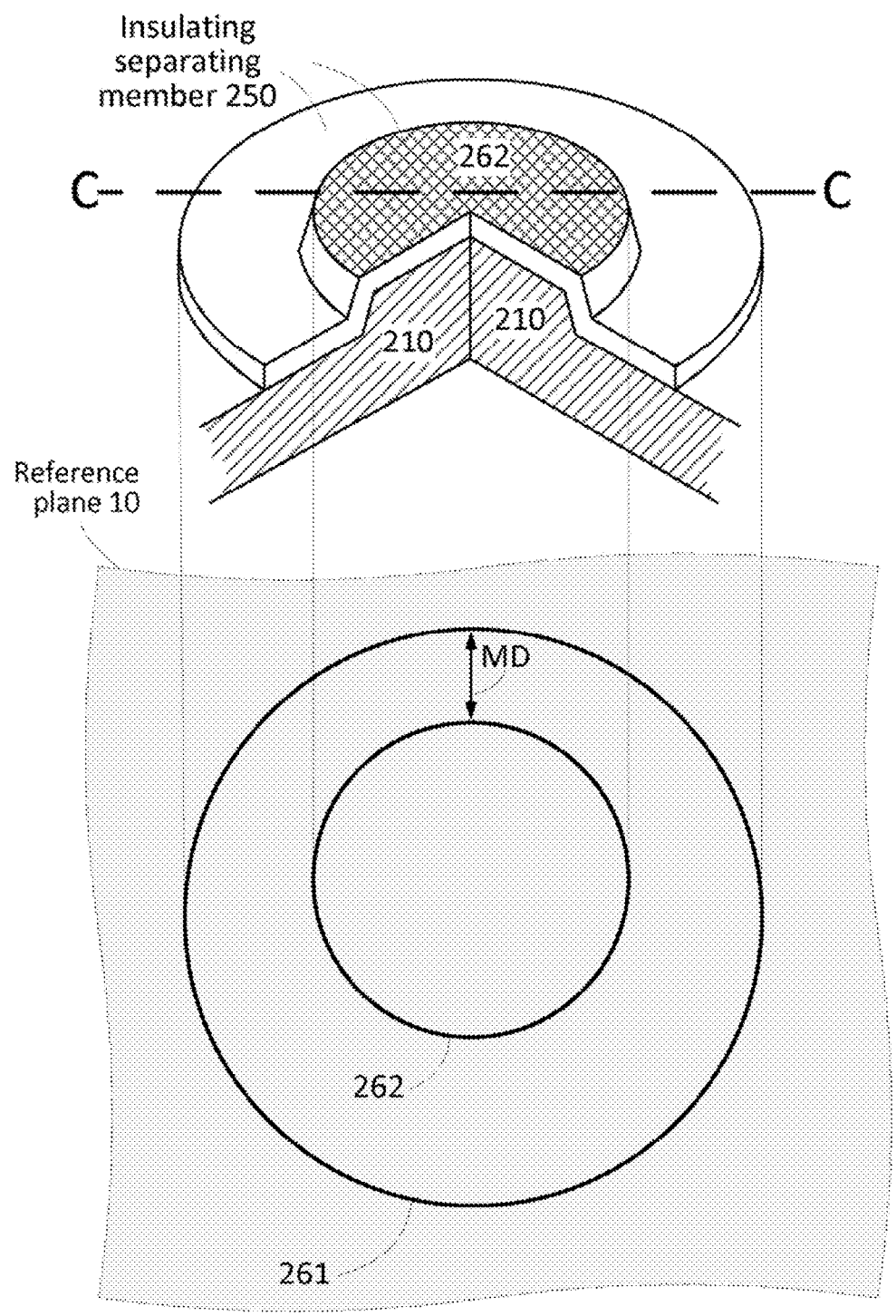
FIG. 1D is a perspective view illustrating a part of a first element and a part of an insulating separating member in an example of an microelectromechanical system, in accordance with the presently disclosed subject matter.

FIG. 1C is an exploded view of FIG. 1B. The cross-sections of first contact area 261 and second contact area 262 are indicated in FIG. 1C as diagonally dashed lines. FIG. 1D is a perspective view illustrating a part of first element 210 and a part of insulating separating member 250 in an example of microelectromechanical system 200, in accordance with the presently disclosed subject matter. Cut-line C-C in FIG. 1D illustrates the cross-section along which the cross-section views of FIGS. 1A and 1B are taken. A portion of both first element 210 and insulating separating member 250 are cut-away in order to better visualize the structure of MEMS 200.

As shown in FIG. 1C, a reference plane 10 is defined, which is substantially parallel to at least one of the first surface 210 and the second surface 220. It is noted that reference plane 10 is an imaginary plane, and it does not necessarily correspond to any actual plane or surface in MEMS 200. It is noted that in many cases, first surface 210 and/or second surface 220 are substantially planar, with the exception of some irregularities or imperfections (whether intended or unintended). Therefore, a reference plane 10 may be defined as substantially parallel to one of these surfaces (and possibly to both).

It is noted that while in the diagrams first surface 212 and second surface 222 are substantially parallel to each other—this is not necessarily so. For example, second element 220 may be connected on one side to a rigid connection and be free on the other side (in order to measure its tilt, for example), in which case the surfaces are not parallel at all times (if at all).

In MEMS 200, the first contact area 261 defines a first projection 271 which is a projection of a circumference of the first contact area 261 on a reference plane 10 which is substantially parallel to at least one of the first surface 210 and the second surface 220. The second contact area 262 defines a second projection 272 which is a projection of a circumference of the second contact area on the reference plane.

In MEMS 200, these projections 271 are 272 do not overlap and are therefore different in size. Therefore, these projections on reference plane 10 are distanced from each other, as can be seen in the example of FIG. 1D. A minimal distance (MD) between projections 271 and 272 is defined as the smallest distance between any two points, one on each of these curves (261 and 272). That is, there is no pair $(A_1, B_1)$, where $A_1$ is a point on the first projection 271 and $B_1$ is a point on the second projection 272, so that the Euclidian distance $d(A_1, B_1)$ between points $A_1$ and $B_1$ is smaller than the minimal distance MD. It is noted that in FIG. 1D, first projection 271 and second projection 272 (resulting from the shape of the corresponding parts of insulating separating member 250) are illustrated as off-center with respect to one another. This illustration is meant to emphasize the location of the minimal distance in the illustrated example.

In MEMS 200, the minimal distance MD must qualify with at least one criterion out of the following criterions: the first criterion, the second criterion and the third criterion.

First criterion: the minimal distance MD between first projection 271 and second projection 272 is larger than a minimal separation maintained by the insulating separating member 250 between the first element 210 and the second element 220. The minimal separation (MS) is defined as the smallest distance between any two points, one in each of these elements (210 and 220) in any time during use of MEMS 200. That is, there is no pair $(A_2, B_2)$, where $A_2$ is a point in the first element 210 and $B_2$ is a point in the second element 220, so that the Euclidian distance $d(L(A_2, t), L(B_2, t))$ between the locations of points $A_2$ and $B_2$ which is smaller than the minimal separation MS at any time t during the operation of MEMS 200.

That is, optionally MEMS 200 includes a group of one or more insulating separating members 250 (and possibly all of the insulating separating members in that MEMS 200), so that for each of the one or more insulating separating members $250_i$, MS<$MD_i$. For some uses, the minimal separation maintained by an insulating separating member 250, may be defined locally, as the smallest distance in any time t between any two points $A_{2i}$ and $B_{2i}$, $A_{2i}$ being a point on first surface 212 in an area around the respective first contact area $261_i$ (i.e. of $250_i$) and $B_{2i}$ being a point on second surface 222 in an area around the respective contact area of the second surface 222 (i.e. the area which may contact the respective second contact area $262_i$).

Second criterion: the minimal distance between the first projection 271 and the second projection 272 is larger than a predefined length threshold (PLT). The specific value of the length threshold may be defined based on the dimensions of the MEMS 200, based on the planned minimal separation MS, based on the voltages planned to be carried by the first surface 210 and the second surface 220, and so on. Some predefined length thresholds which were found useful by the inventors for several MEMS design are 0.1, 0.2 µm, 0.5 µm, 1 µm, and 2 µm.

That is, optionally MEMS 200 includes a group of one or more insulating separating members 250 (and possibly all of the insulating separating members in that MEMS 200), so that for each of the one or more insulating separating members $250_i$, PLT<$MD_i$. For example, optionally for each $250_i$, 0.2 µm<$MD_i$. Others values of the PLT (such as the ones provided above as examples) may also be used as PLT in this definition. It is noted that even if the PLT is 0.2 µm, the smallest minimal distance $MD_i$ in the group of insulating separating members may be larger (e.g. 1.153 µm).

It is noted that the predefined length threshold may be set (e.g. during a design stage of MEMS 200) based on one series of considerations (e.g. electric considerations such as preventing breakdowns, which are discussed below), while the actual smallest minimal distance $MD_i$ may be determined by other factors and considerations (e.g. mechanical considerations such as stability and durability, and manufacturing accuracy).

Third criterion: the minimal distance between first projection 271 and second projection 272 is larger than a manufacturing accuracy of the separating member.

The term "manufacturing accuracy" is well accepted in the art. If MEMS 200 is fabricated as one out of a plurality of similar microelectromechanical systems on a batch of one or more wafers, each of the plurality of the similar microelectromechanical systems having an insulating separating member in a similar location with respect to the respective microelectromechanical system (and therefore that insulating separating member includes a second contact area having a largest dimension), then the term "manufacturing accuracy" may be defined in a non-limiting way as a smallest threshold which is larger than 95% of the largest dimensions of the second contact areas.

If MEMS 200 includes a plurality of similar insulating separating members in different locations with respect to the microelectromechanical system (each of these insulating separating members includes a second contact area having a largest dimension), then the term "manufacturing accuracy" may be defined in a non-limiting way as a smallest threshold which is larger than 95% of the largest dimensions of the second contact areas.

Referring to the above examples, it is noted that a single wafer may include a single MEMS 200, or a plurality of which (e.g. as a consequence of the relative size of the MEMS with respect to the wafer).

Referring to each of the three criterions above, it is noted that if first surface 210 and second surface 220 are not parallel to each other (and therefore at least two non parallel planesi.e. intersecting planes- may be defined), the projections 271 and 272 onto one of these reference planes must fulfill the selected criterion for minimal distance. The projections of the circumferences of the first contact area 261 and on the second contact are 262 onto any other plane which is substantially parallel to at least one of the first surface 210 and the second surface 220 may or may not meet a parallel criterion (relating to the minimal distance between the projections onto that plane).

The geometric shape of insulating separating member 250 has both electric and mechanical effects on its surroundings, and may serve electric and/or mechanical needs.

First, insulating separating member 250 may serve to prevent a short circuit which may occur if the two conductive surfaces 212 and 222 will come to contact.

Other electric effects of the geometric shape of insulating separating member 250 on the operation and behavior of MEMS 200 relate to the possibility and the conditions in which breakdown may occur through medium 100 and/or through insulating separating member 250 or on its surface.

A breakdown through the insulating medium 100 which is contained between first element 210 and second element 220 may occur if the electric field in at least a portion of that medium 100 exceeds a breakdown voltage of that medium. The term "breakdown voltage" is well accepted in the art, and should be construed in a non-limiting way to refer to the minimum electrical field that causes a portion of medium 100 to become electrically conductive.

Fabricating of insulating separating members (of any shape) connected to a conductive material (such as the conductive material of surfaces 210 and 220) often results in a notch formed along the circumference of the contact area between the insulating matter and the conductive matter.

It is noted that insulating separating member 250 is not necessarily built on a protuberance in the first element 210. For example, FIG. 1E is a cross-sectional view illustrating a part of an example of an microelectromechanical system, in accordance with the presently disclosed subject matter. Also, while the insulating separating member 250 is illustrated as a unified unit, it may be fabricated from more than one insulating materials (e.g. fabricated in two different layers).

FIGS. 2A, 2B, 2C, 2D and 2E are various views illustrating a part of an example of microelectromechanical system 200 which includes a notch 280, in accordance with the presently disclosed subject matter. It is noted that while the notch 280 is illustrated as having similar dimensions (e.g. depth, height) along the entire circumference, this is not necessarily so, and the dimension of the notch (or notches) may vary.

Figure 2A:
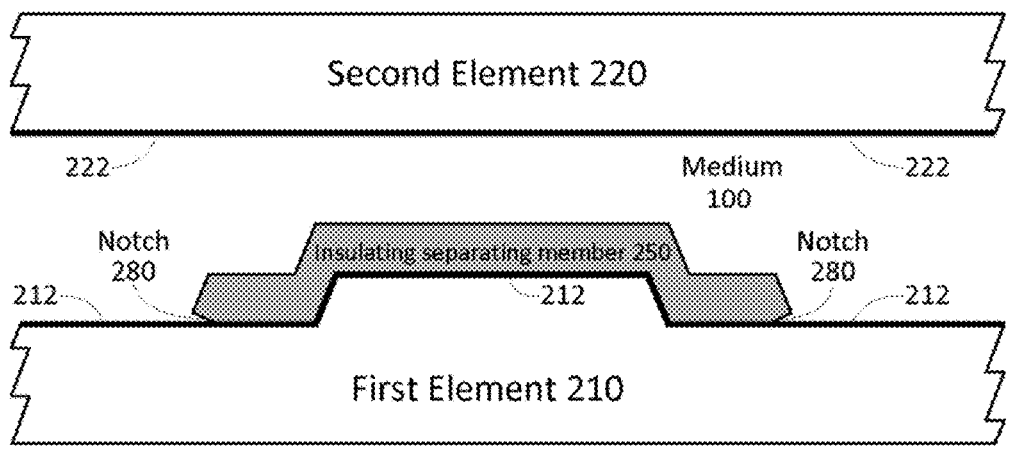
FIGS. 2A, 2B, 2C, 2D and 2E are various views illustrating a part of an example of an microelectromechanical system which includes a notch, in accordance with the presently disclosed subject matter.
Figure 2B:
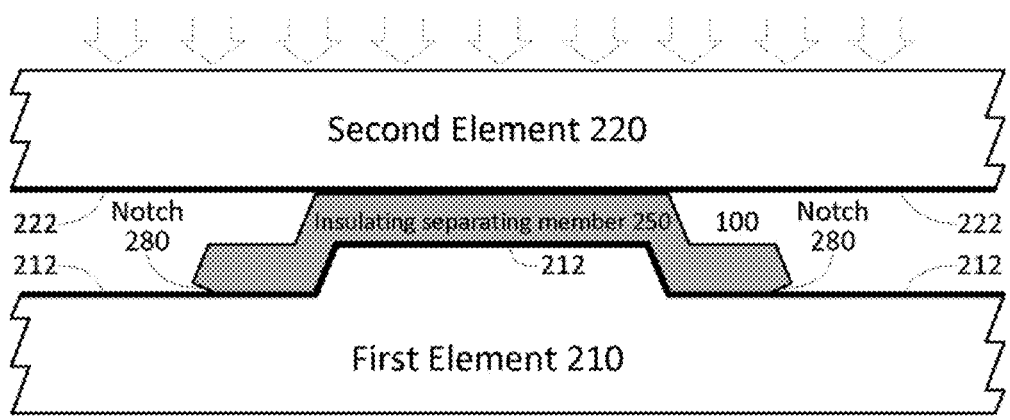
Figure 2E:
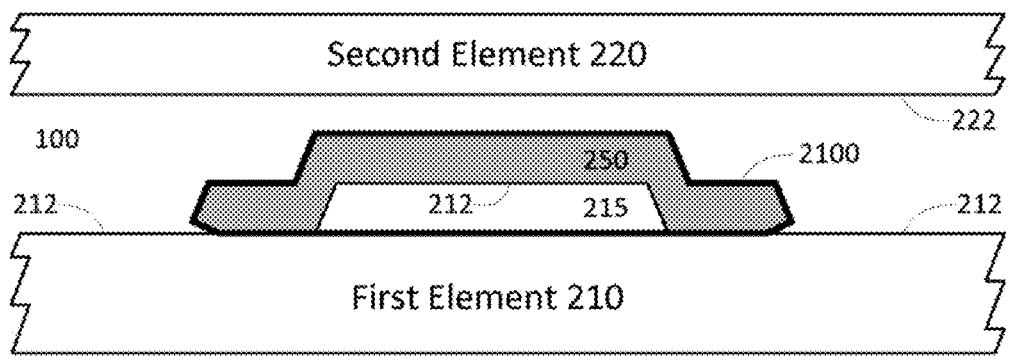
Figure 2C:
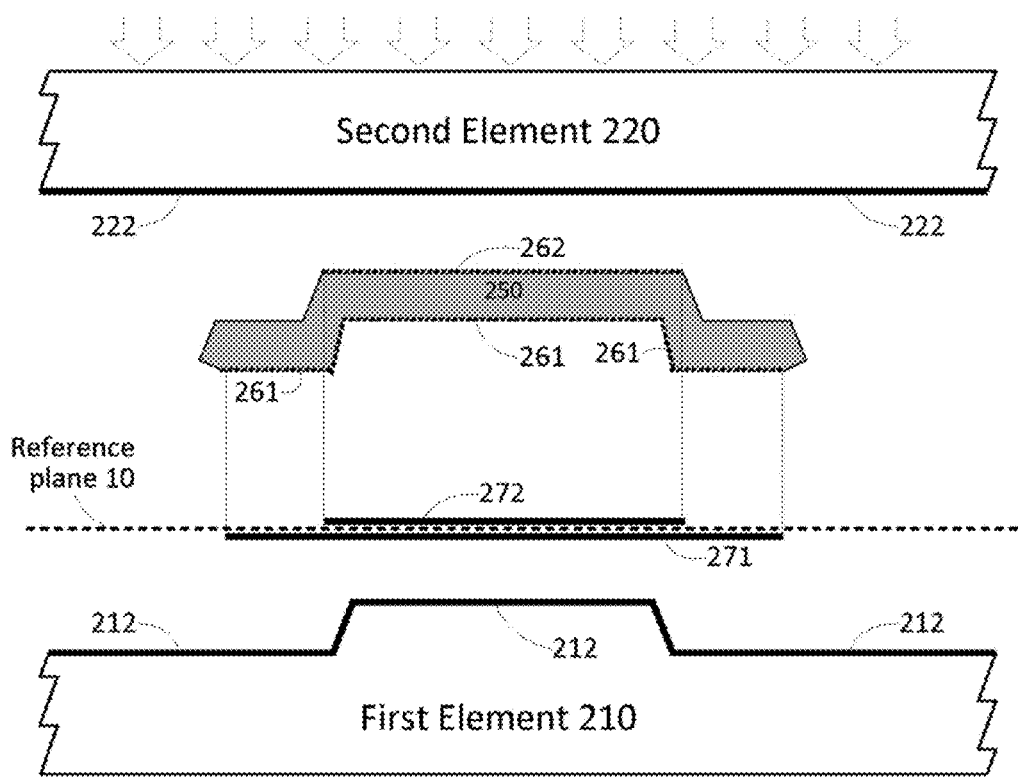
Figure 2D:
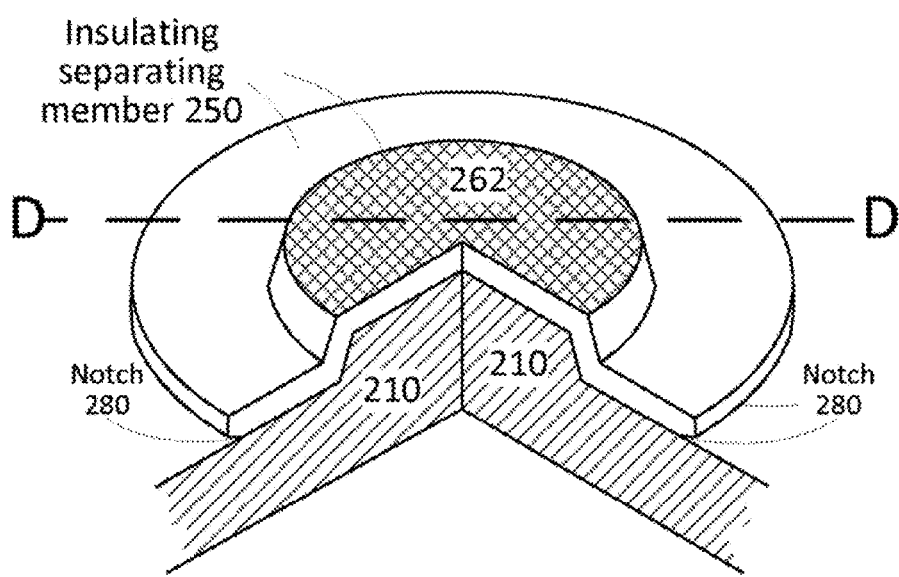

Referring for example to FIG. 2E, it is noted that insulating separating member 250 may be part of a larger separating member 2100, which may include conductive parts as well. Furthermore, separating member 2100 may include parts of first element 210 (as illustrated, part 215) and/or parts of second element 220 (not illustrated).

Optionally, MEMS 200 may include separating member 2100 which includes at least insulating separating member 250 and a part 215 of first element 210 which extends from a surface plane of first element 210 towards second conductive surface 222. As aforementioned, first surface 210 may be substantially a plane (here referred to as the surface plane of first element 210), with the exception of some irregularities or imperfections (whether intended or unintended), such as part 215.

Separating member 2100, if implemented, is operable to mechanically maintain a separation between the first surface 212 and the second surface 222. Separating member 2100 mechanically prevents first element 210 and second element 220 to come closer to each other than a maintained separation distance, by applying mechanical forces.

Figure 3A:
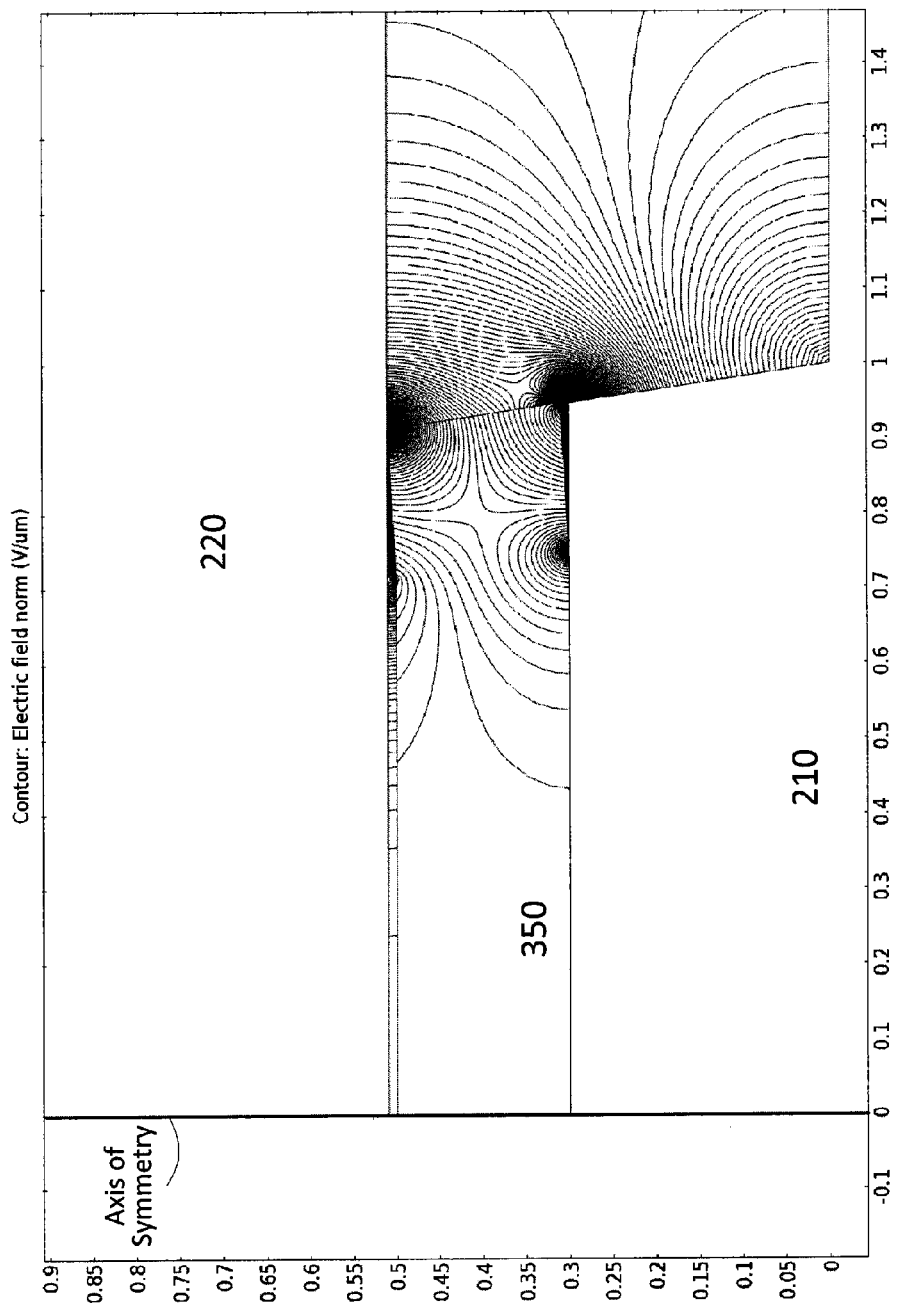
FIGS. 3A, 3B and 3C are results of simulation of the electric fields around a simulated insulating separating members of different shapes.
Figure 3B:
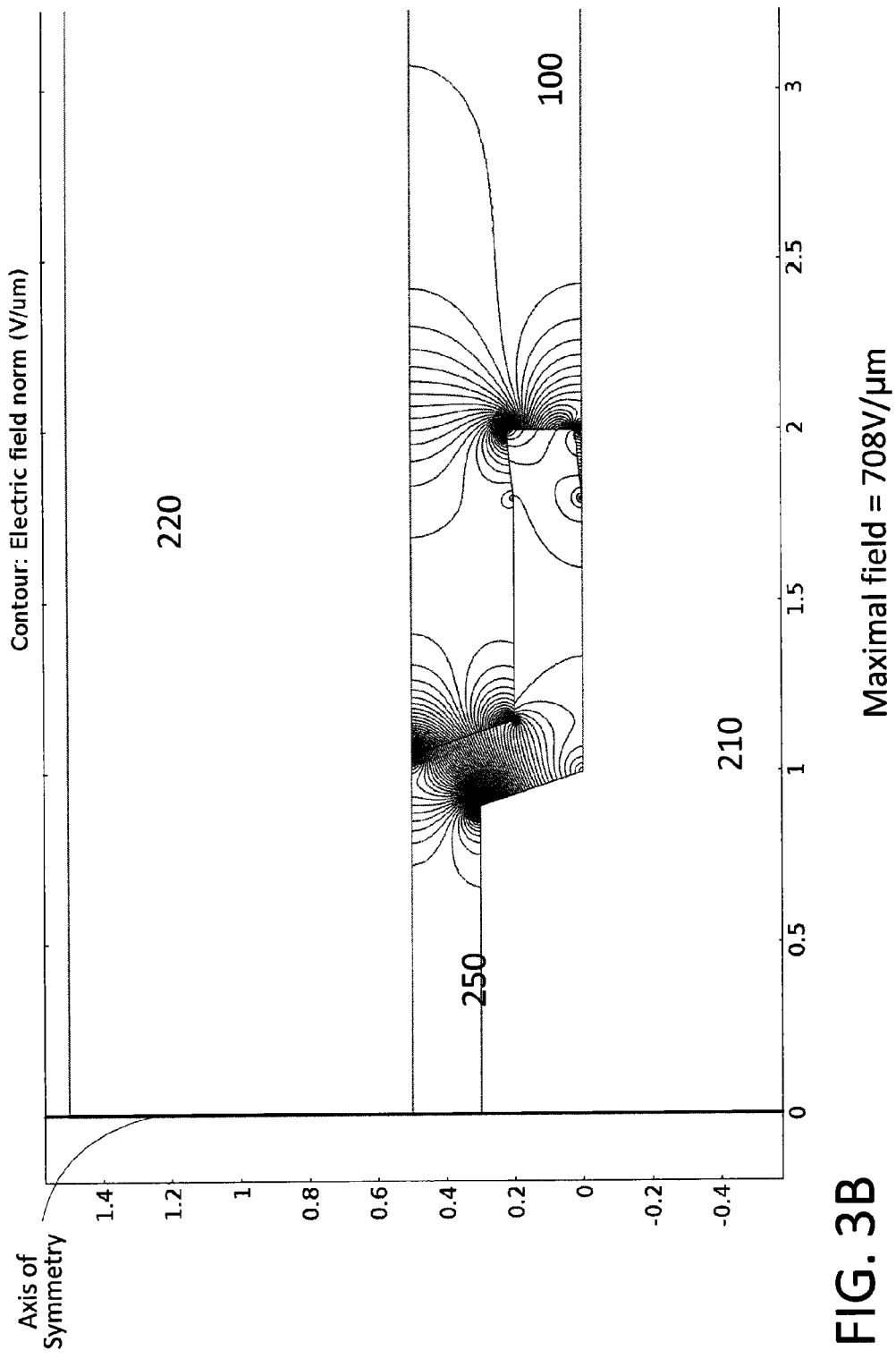
Figure 3C:
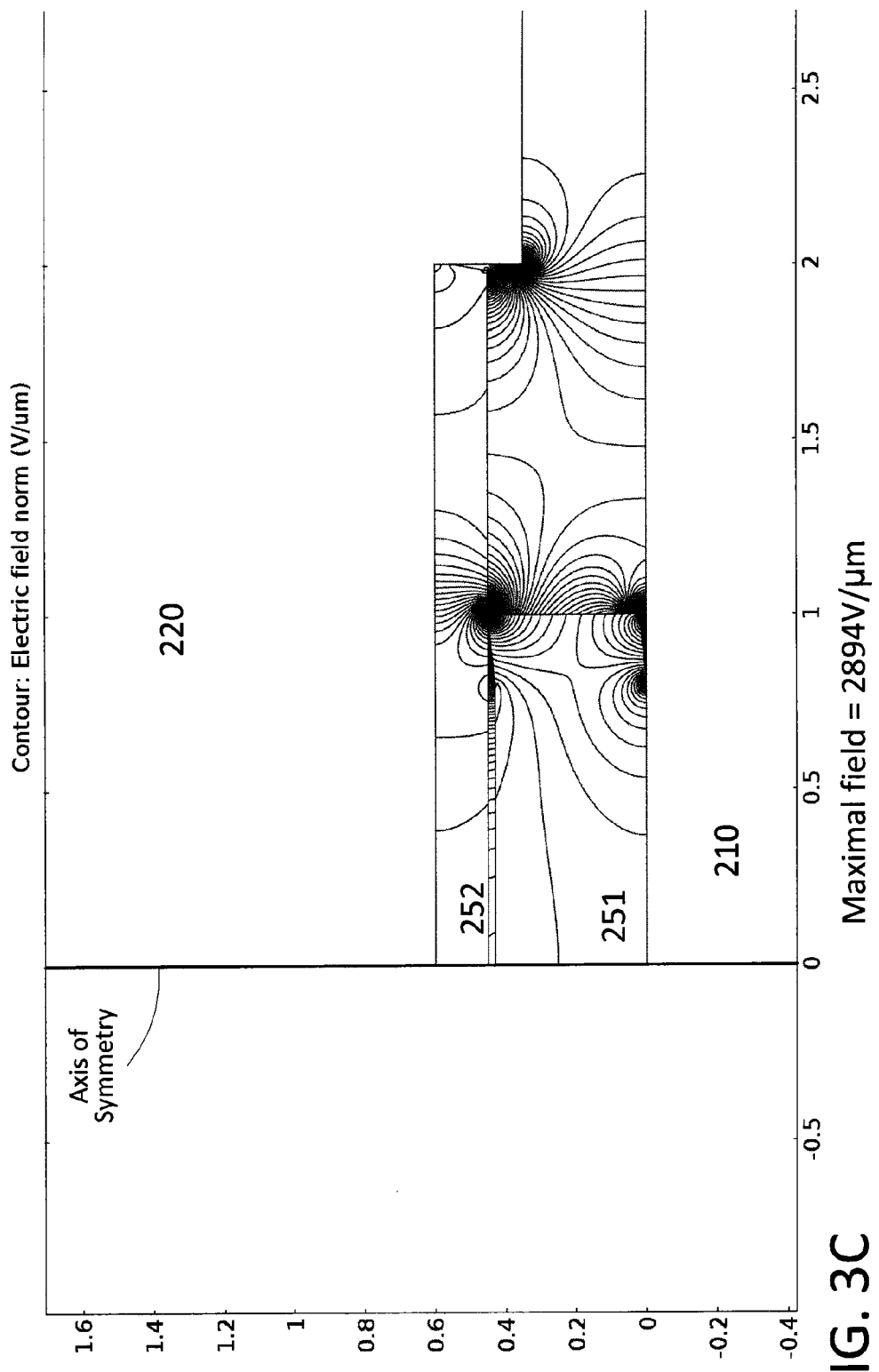

FIGS. 3A, 3B and 3C are results of simulation of the electric fields around simulated insulating separating members of different shapes. As is exemplified in these drawings, the geometry of the notch may result in an electric field inside the notch which exceeds by far the electric field outside the notch.

Different geometries for an insulating separating member were simulated. All simulations assumed axis-symmetrical conditions. The electric field showed a voltage between the conductive surfaces of 75V. The units on the abscissa and the ordinate denotes a distance (in micrometers). Breakdown voltage of SiN is typically larger than 800 V/$\mu$m. Breakdown voltage of SiO2 varies between 1000V/$\mu$m (CVD) to 10 KV/$\mu$m (thermal).

The curved lines in the simulations of FIGS. 3A, 3B and 3C are isolines (also referred to as contour line). i.e. each of the curves includes points in which the electric field has the same intensity.

In FIG. 3A the insulating separating member 350 is a simple dimple whose geometry is not in accordance with the presently disclosed subject matter. The projections of the contact areas of the insulating separating member with the conductive surfaces are about 0.15 $\mu$m while the minimal separation between the surfaces is larger-about 0.2 $\mu$m.

FIGS. 3B and 3C are simulation of a microelectromechanical system 200, in accordance with the presently disclosed subject matter. As can be seen, the maximal electric field in the system of FIG. 3B (Maximal field=708V/$\mu$m) and in the system of FIG. 3A (Maximal field=2894V/$\mu$m)—which are in accordance with the presently disclosed subject matter-is substantially lower than the maximal electric field in the system of FIG. 3A (Maximal field=8585V/$\mu$m).

Referring to MEMS 200 (e.g. with respect to drawings 2A, 2B, 2C and 2D), optionally along at least a portion of the circumference of first contact area there 261 is a notch 280 between the insulating separating member and the first surface 212 in which prevails an electric field (hereinbelow referred to as "internal electric field") whose intensity is at least two times larger than an intensity of an external electric field adjacent to the notch 280. The minimal distance MD keeps the internal electric field (i.e. inside the notch) below an electrical breakdown voltage of medium 100 which is included in the notch.

Especially, the minimal distance MD keeps the internal electric field (i.e. inside the notch) below electrical breakdown voltage of any medium located inside the notch. More generally, the minimal distance MD may keep the electric field in any medium immersing the insulating separating member 250 below its electrical breakdown voltage.

As exemplified in FIGS. 1A-D and 2A-D, the insulating separating member may be made of a single unit. That is, optionally, the insulating separating member 250 is a unified separating member which includes the first contact area 261 and the second contact area 262. In such cases, the second contact area 262 is operable to be separated from the second surface 220 as a result of a relative movement of the second element 220 farther from the first element 210. However, this is not necessarily so, and the insulating separating member 250 may be made from more than one part.

Figure 5A:
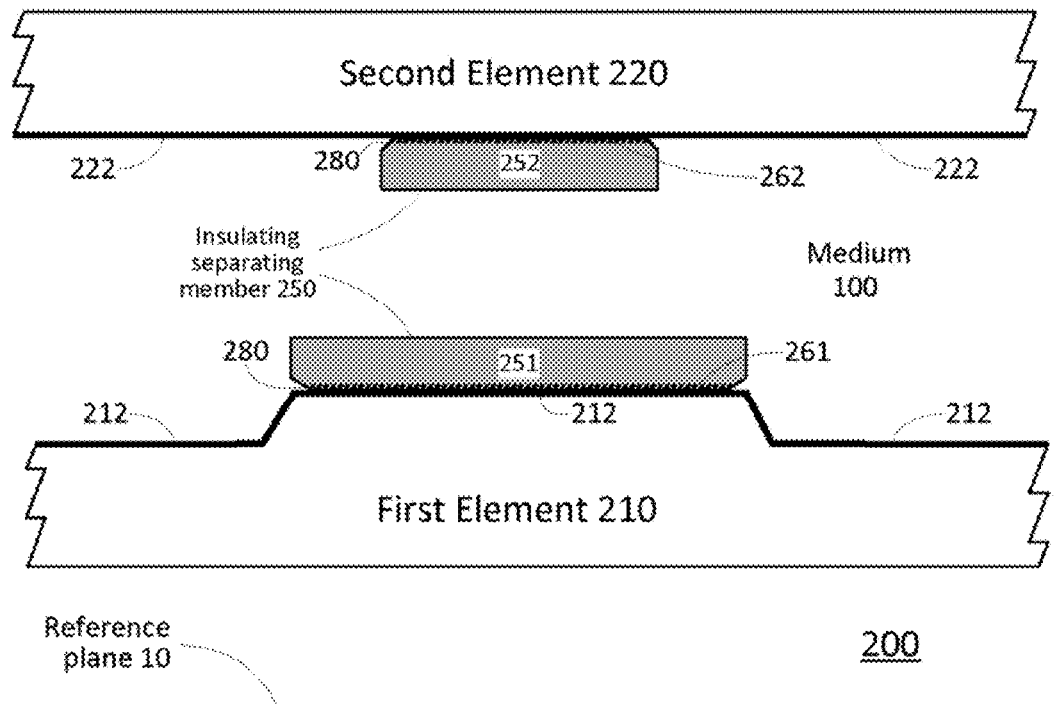
FIGS. 5A and 5B are cross-sectional views illustrating a part of an example of an microelectromechanical system, in accordance with the presently disclosed subject matter.
Figure 5B:
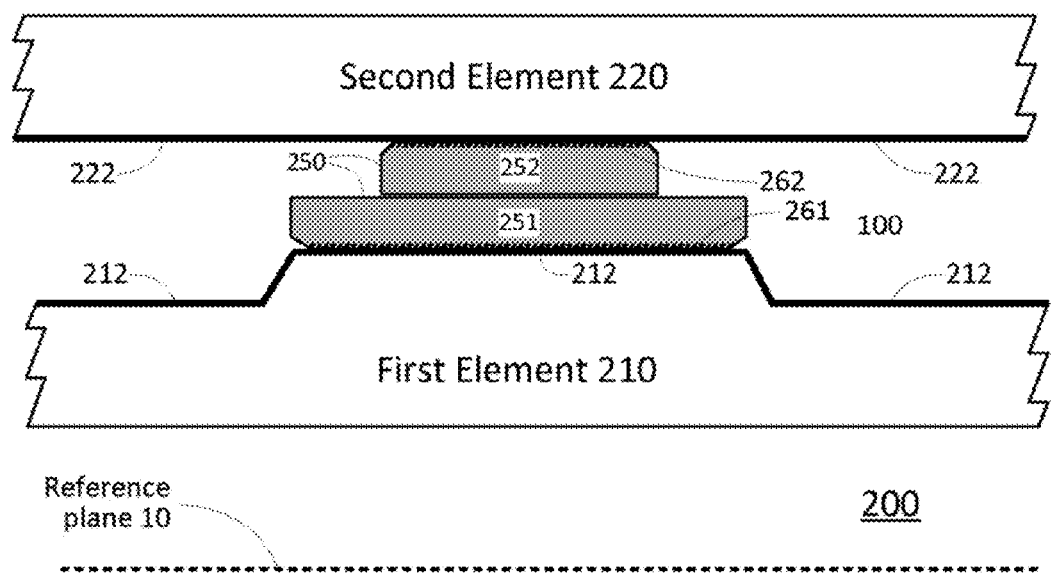

FIGS. 4A and 4B are cross-sectional views illustrating a part of an example of microelectromechanical system 200, in accordance with the presently disclosed subject matter. FIGS. 5A and 5B are cross-sectional views illustrating a part of an example of microelectromechanical system 200, in accordance with the presently disclosed subject matter. In these two examples, the insulating separating member includes two parts which may be separated from each other.

Generally, insulating separating member 250 may optionally include first separator section 251 which includes first contact area 261, and second separator section 252 which includes second contact area 262 which in this case connects the second separator section 252 to the second surface 222. The connection between the second separator section 252 and the second surface 222 in such a case may be a durable connection (e.g. a permanent one). Second separator section 252 is operable to be separated from first separator section 251 as a result of a relative movement of second element 220 farther from first element 210.

Such a geometry (when compared, for example, to the unified insulating separating member geometry exemplified in FIGS. 1A-D and 2A-D) have different mechanical and electric effect on the environment of insulating separating member 250. The geometric shape of insulating separating member 250 has both electric and mechanical effects on its surroundings, and may serve electric and/or mechanical needs. Some of the mechanical effects of the geometric shape of insulating separating member 250 on the operation and behavior of MEMS 200 relate to the wear of various components of MEMS 200 over time.

Depending on the materials on which MEMS 200 is made of, the hardness of the insulating separating member 250 may be larger than the hardness of the first element 210 and of that of the second element 220 (or at least of surfaces 212 and 222 respectively). This is the case, for example, if surfaces 212 and 222 are made of polycrystalline silicon, and the insulating separating member is made of silicon nitride. When elements 210 and 220 are brought closer to each other, the two sections of the insulating separating member 250 collide with each other, and no part of insulating separating member 250 collides with exposed conductive material. This way, collision impacts on the underlying polysilicon (or equivalent material) are attenuated.

Especially, the second separator section 252 attenuates collision impact resulting from a relative movement of the second element 220 towards the first element 210, thereby serving as wear protection for the second element 220. Alternatively or additionally, the first separator section 251 attenuates collision impact resulting from a relative movement of the second element 220 towards the first element 210, thereby serving as wear protection for the first element 210.

Designing a reduced second contact area 262 in order to increase the minimal distance means that the entire collision energy is transferred to the second element 220 via a smaller area. Designing the insulating separating member 250 so that it is made of two such sections assists in mitigating the mechanical wear effects on the second element 220.

Optionally, at least one of the sections 251 and 252 may be wholly or partially sunk in the layer of the respective element (210 or 220). For example, optionally first separator section 251 is at least partially included in a recess in the first element 210 so that no part of the first separator section 251 extends outside the recess to a height which is larger than a third of a total height of the first separator section 251. Height of the first separator section 251 is measured along an axis which is perpendicular to an Imaginary plane which is substantially parallel to the first surface 210, as discussed above.

Optionally second separator section 252 is at least partially included in a recess in the second element 220 so that no part of the second separator section 252 extends outside the recess to a height which is larger than a third of a total height of the second separator section 252. Height of the second separator section 252 is measured along an axis which is perpendicular to an imaginary plane which is substantially parallel to the second surface 220, as discussed above.

Figure 6A:
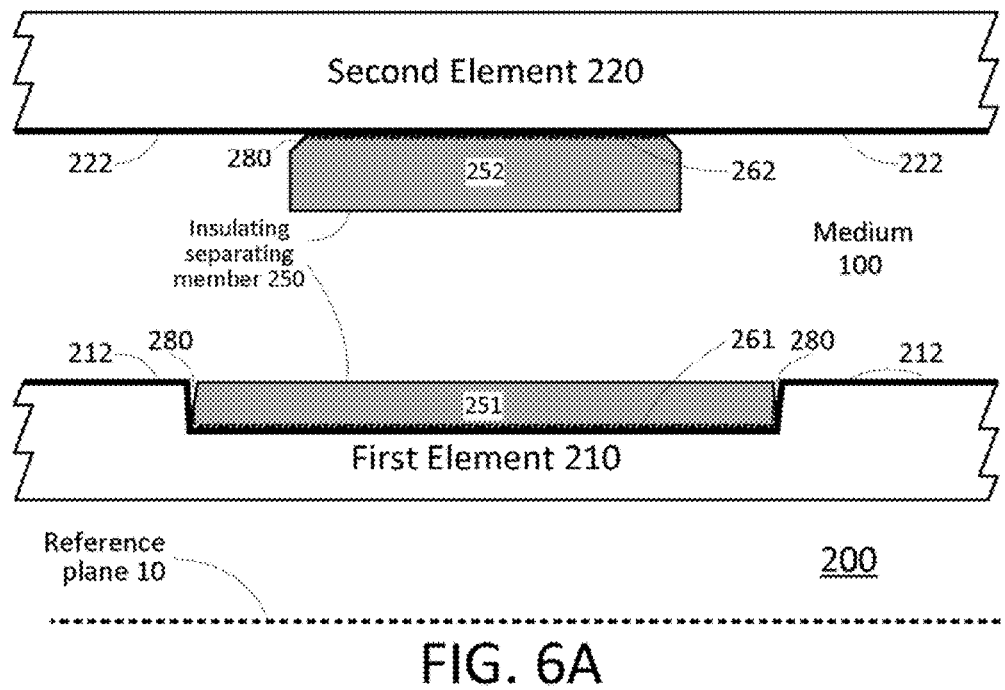
FIGS. 6A and 6B are cross-sectional views illustrating a part of an example of microelectromechanical system, in accordance with the presently disclosed subject matter.
Figure 6B:
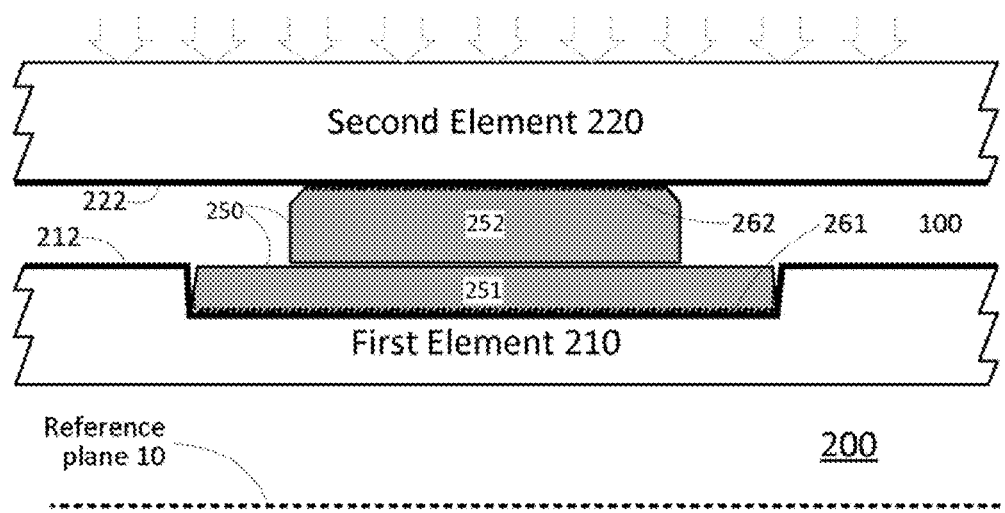

Referring to the example of FIGS. 6A and 6B, it is noted that the mechanical response to shock of the sunk section of insulating separating member 250 is different than that of the section which is totally external to its respective element (210 or 220). Since one of the cross sections 261 and 262 is necessarily smaller than the other, selecting which of the sections 251 and 252 will be sunk may depend on the relative sizes of the respective contact areas. It is noted that if one of sections 251 and 252 is entirely sunk in a corresponding recess, than it must be the larger of the two (at least in a contact surface between the two), in order to avoid shortcuts.

Optionally, if first separator section 251 is at least partially included in a recess in the first element 210 (as discussed above), the first separator section 251 is larger than the second separator section 252.

It should be noted that in some cases, due to process constraints the surface of the sunk first separator section 251 is actually lower than first surface 212. In such a case, the height of second separator section 252 should be adjusted to maintain the minimum space possible between surfaces 212 and 222.

Figure 6C:
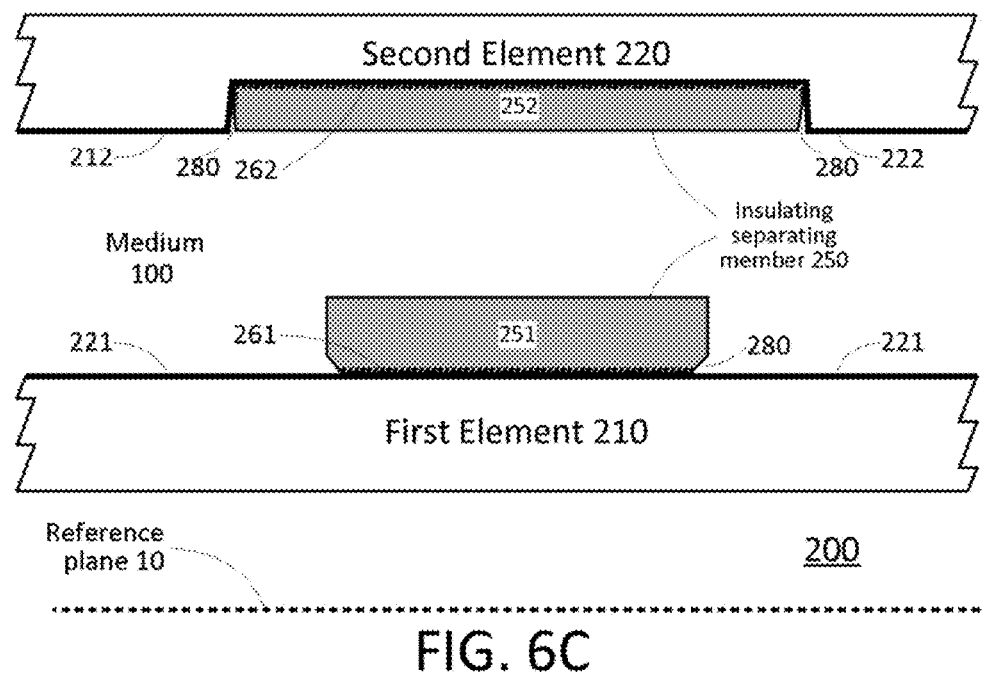
FIGS. 6C and 6D are cross-sectional views illustrating a part of an example of microelectromechanical system, in accordance with the presently disclosed subject matter.
Figure 6D:
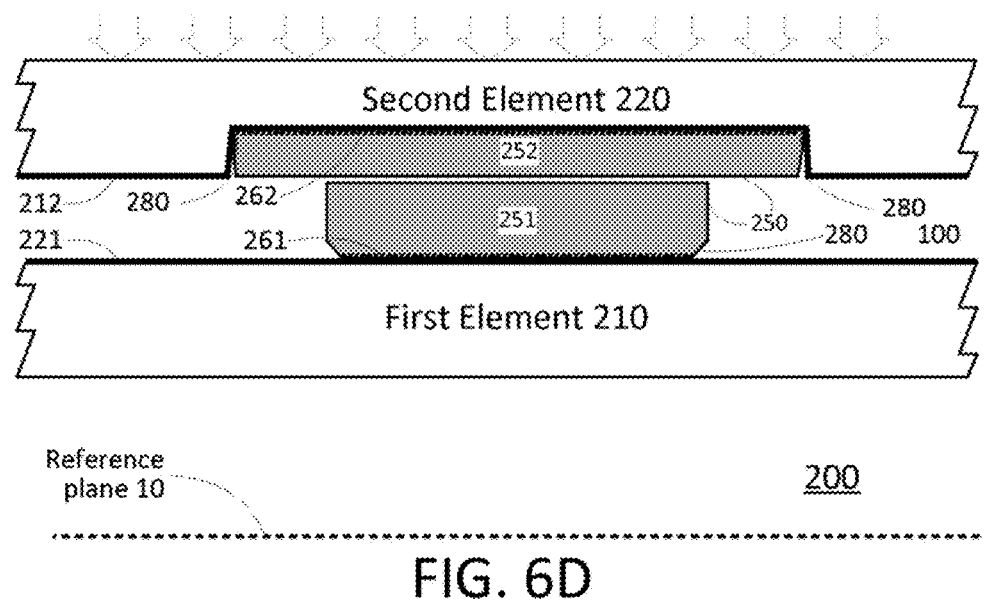

FIGS. 6C and 6D are cross-sectional views illustrating a part of an example of microelectromechanical system 200, in accordance with the presently disclosed subject matter. It is noted that FIGS. 6C and 6D illustrate a system in which the locations and functionality of first element 210, second element 220 and insulating separating member 250 are reversed. These illustrations are provided only for illustrative reasons, because the directions in the drawings (e.g. up and down) do not necessarily correspond to real-life directions of the illustrated components.

For example, MEMS 200 are usually fabricated from a bottom level (the substrate) upwards, deposing layers one onto the other. However, the fabrication order of the layers and/or components in the drawings may be reversed- e.g. in FIG. 1A, the second elements 220 may be fabricated before the first element 210. That is, second element 220 may be closer to a substrate on which MEMS 200 is generated.

The illustrations of FIGS. 6C and 6D are provided also in this reverse form, because in some production methods it is easier to manufacture the second separator section 252 and only afterwards to fabricate the second element 220, than to produce the second element 220 with a recess in it. Generally, however, the order of fabrication is not suggested by the directions of the other drawings, and can be decided based on various reasons (which may also pertain to parts of the MEMS 200 external to the illustrated parts).

In the discussion above, the geometrical considerations mainly related to the sizes of contact areas 261 and 262, to the distances between projections 271 and 272, and to the distance between elements 210 and 220. Additional considerations and limitations may relate to other aspects of the shape of insulating separating member 250.

In the above provided examples, an exterior of insulating separating member 250 is substantially shaped as two cylinders (with some variations such as slopes and notches).

Figure 7A:
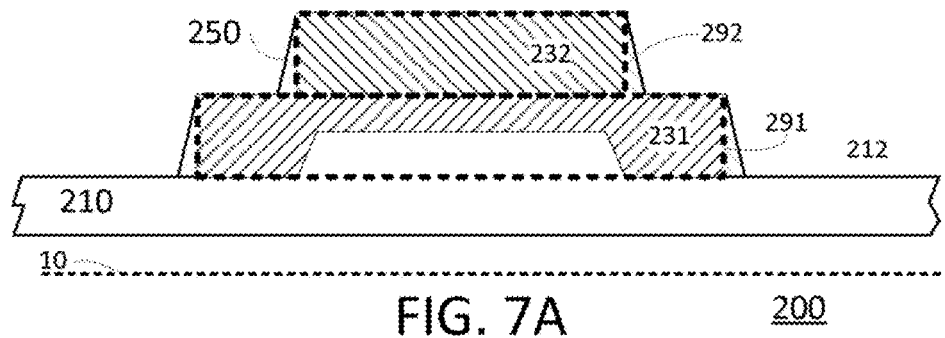
FIGS. 7A, 7B and 7C are cross-sectional views illustrating various examples for a part of an microelectromechanical system, in accordance with the presently disclosed subject matter.
Figure 7B:
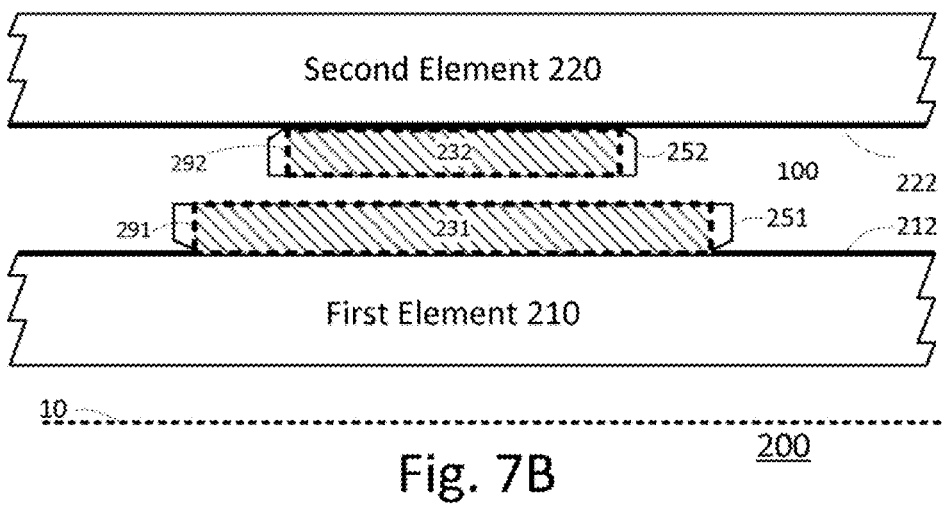
Figure 7C:
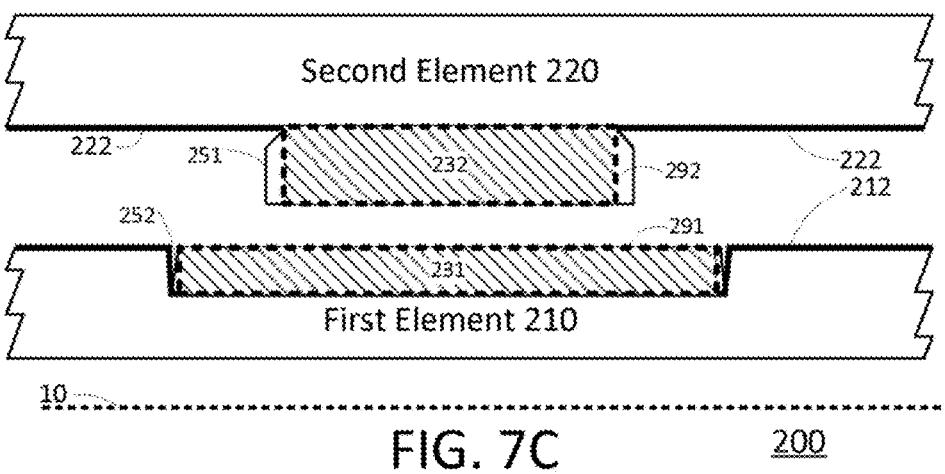

FIGS. 7A, 7B and 7C are cross-sectional views illustrating various examples for a part of microelectromechanical system 200, in accordance with the presently disclosed subject matter. Optionally, insulating separating member 250 includes a first separator part 231 (indicated in the drawings with diagonal lines) and a second separator part 232 (indicated with oppositely diagonal lines in the drawings), which fulfill the following conditions A, B, C, and D:

Condition A. The convex envelope 291 of the first separator part 231 is substantially prismatic (e.g. a cylinder, a box, a cube); (optionally, convex envelope 291 must be a right prism);

Condition B. The convex envelope 292 of the second separator part 232 is substantially prismatic; (optionally, convex envelope 291 must be a right prism);

Condition C. The first separator part 231 and the second separator part 232 combinedly include at least 85% of a totality of insulating solid matter of the separating member 250;

Condition D. For each direction parallel to the reference plane 10, a first length (L1) is defined as a largest length of a cross section of first separator part 231 along the direction, and a second length (L2) is defined as a largest length of a cross section of second separator part 232 along the direction; and the larger of L1 and L2 is larger than the minimal separation (MS) maintained by the insulating separating member between the first element and the second element.

It is noted that in mathematics, the convex envelope of a set X of points in the Euclidean space is the smallest convex set that contains X. In Euclidean space, a set of points is convex if for every pair of points within the set, every point on the straight line segment that joins them is also within the set.

The term "prismatic" is well accepted in the art, and should be construed in a non-limiting way to refer a three dimensional shape with two parallel identical bases in two parallel planes, and straight sides. All cross-sections parallel to the bases are the same.

FIGS. 8A and 8B are cross-sectional views illustrating a part of an example of microelectromechanical system 200, in accordance with the presently disclosed subject matter. These illustrations provide an example for a MEMS 200 in which two conductive surfaces move with respect to each other, and a plurality of insulating separating members 250 are used for maintaining a separation between them. FIGS. 8A and 8B illustrate the same system at different times.

MEMS 200 in FIGS. 8A and 8B includes a plurality of double-sided electrostatic actuator elements (one of which is illustrated), and may serve, for example, as a speaker in which actuation of the electrostatic actuator elements results in movement of air, and hence in controlled sound waves.

The actuator element includes a second element 220 which is a moving element (herein below denoted 220') which is mechanically connected to the stationary portions of the actuator element by means of a suitable flexure 150 such as a flexure or spring. The flexure 150 defines an axis 125 along which the moving element 220' can travel, prevents the moving element 220' from travelling in other directions, and defines an at-rest position of the moving element 220' (as illustrated in FIG. 8A). The actuator element further includes two electrodes 290' and 210', also referred to hereinafter as "A-electrode" and "B-electrode" respectively, disposed on opposite sides of the moving element 220'. The second electrode 210' is the first element 210 in this case. The moving element 220' is separated from the electrodes 290' and 210' by separating spacers 180 and 190.

Insulating separating members 250 in accordance with the presently disclosed subject matter are formed on the surfaces of the electrodes 290' and 210' respectively which each face the moving element 220'. More generally, separating members 2100 may also be used.

FIG. 8A shows the moving element 220' in its resting position, with no voltage applied between the moving element 220' and either electrode 290' and 210'. Applying a voltage between the moving element 220' and either electrode produces an electrostatic force attracting the moving element 220' towards that electrode, the magnitude of the electrostatic force being proportional to the magnitude of the voltage applied, and inversely proportional to the square of the separation distance between facing surfaces of moving element 220' and the respective electrode (e.g. the first surface of electrode 210' and the second surface of moving element 220'). At the same time, any movement of the moving element 220' away from its resting position causes flexure 150 to exert on the moving element 220' a spring force pulling it back towards its resting position. Moving element 220' may also be affected by other forces such as damping or friction forces which may either occur naturally or be deliberately introduced for practical reasons such as to improve long-term reliability. However, such additional forces are not required for the purpose of the present invention. The moving element 220' may reach an equilibrium position where the sum of all forces acting on it is zero, or it may be latched.

FIG. 8B shows the moving element 220' latched in the B-position, as close as possible to electrode 210' and as far as possible from electrode 290'. Latching of the moving element 220' into the B-position and release from the B-position may be achieved by controlling the voltages applied to electrode 210' to the moving element 220'. Latching moving element 220' may also be achieved by controlling the voltages applied to electrode 210' to the moving element 220'.

When the voltage between these two conductors falls below a hold voltage, the electric force becomes smaller in magnitude than the spring force of the flexure 150, causing moving element 220' to move away from the B-position and towards its resting position, a process referred to hereinafter as "release".

When moving element 220' reaches its resting position during transitions between the two extreme positions, it has non-zero kinetic energy and linear velocity relative to electrodes 290' and 210' and therefore continues to travel towards its new extreme position until its kinetic energy is absorbed by flexure 150.

Insulating separating members 250 in this system 200 are used to maintain a separation between moving element 220' and electrodes 210' and 290' (e.g. in order to avoid an electric short circuit and control damping).

Insulating separating members 250 in this system 200 may also be used for other purposes, such as in order to maintain an air gap 140, thereby allowing air to flow through holes 180 in the electrode 290' and into the space between the moving element 220' and first electrode 290' more easily than would be the case without an air gap, thereby facilitating a faster release of moving element 220' from the A-position. The term "air gap" is used herein merely by way of example since the apparatus of the present invention normally operates in air however this need not be the case and alternatively, for example, the apparatus may operate in any other suitable medium.

Optionally, microelectromechanical system 220 may be such that the first element 210 is a planar member (e.g. electrode, capacitor plate etc.) and the second element 220 is a moving member which is operable to constrainedly move nearer and farther from the planar member in response to a controlled temporal sequence of potential differences between the planar member and the moving member (e.g. by applying voltage VB by connecting power source 145 as illustrated in FIG. 8B). The controlled temporal sequence of potential differences is controlled by an external controller (not shown, usually external to MEMS 200) in response to a signal inputted to the controller (e.g. a digital signal). The controller may be operable to control a voltage of the moving member and a voltage of the planar electrode to apply the sequence of potential differences.

The moving elements and electrodes may optionally be fabricated from an electrically conductive material, such as doped monocrystalline silicon, doped polycristalline silicon, or aluminum, or at least contain an electrically conductive layer. Spacing layers 180 and 190 between moving elements and electrodes may optionally be fabricated from an electrically insulating material, such as silicon dioxide, or at least contain an electrically insulating layer. Flexures 150 may be fabricated from a material capable of elastic deformation without plastic deformation, such as monocrystalline silicon, or polycrystalline silicon, such that flexures do not retain any permanent deformation in the absence of electrostatic forces.

Figure 9:
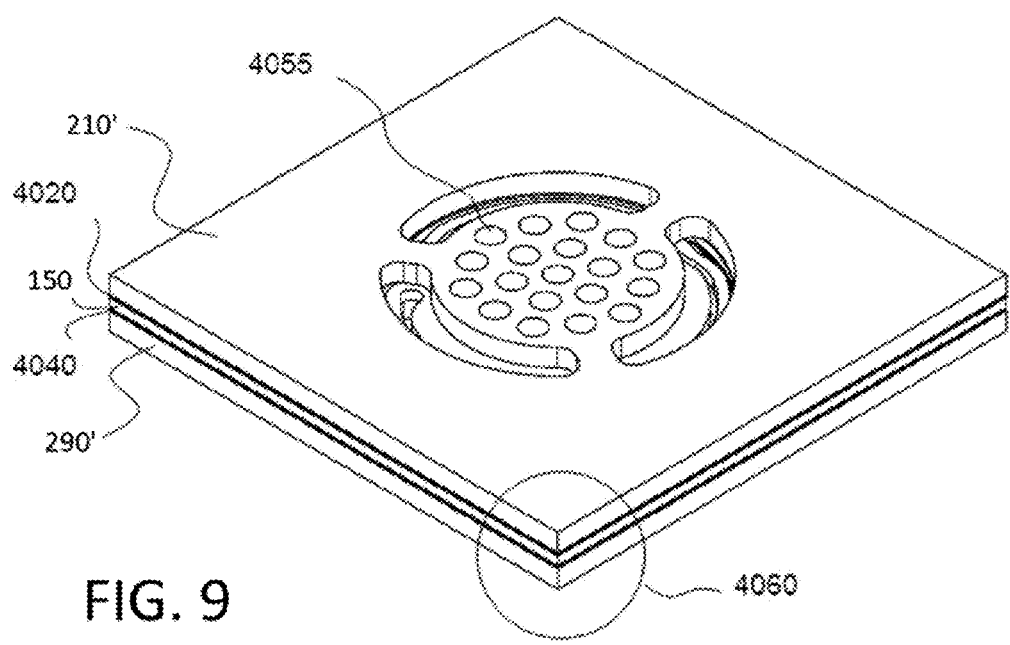
FIG. 9 is an isometric view of the double-sided electrostatic actuator referred to in FIGS. 8A and 8B, in accordance with the presently disclosed subject matter.

FIG. 9 is an isometric view of the double-sided electrostatic actuator referred to in FIGS. 8A and 8B, in accordance with the presently disclosed subject matter. A flexure layer 150 is interposed between two rigid electrodes 210' and 290' layers which are separated from flexure 150 by layers 4020 and 4040 and by insulating separating members 250. To provide appropriate operation, the electrodes comprise an array of through-holes 180 providing sufficient air passing through, to generate sound as required by the application.

FIG. 10 is a flow chart illustrating an example of method 500, in accordance with the presently disclosed subject matter. Method 500 is a method for fabrication of a microelectromechanical system. Referring to the examples set forth with respect to the previous drawings, method 500 may be used to fabricate MEMS such as MEMS 200 described above. It will be clear to a person who is of skill in the art that variations of method 500 may be used for the fabrication of any of the above discussed variations of system 200. Method 500 may be implemented by one or more fabrication machines which are usually used in semiconductor fabrication plants (FABs).

Method 500 includes stage 520 of obtaining a substrate. For example, stage 520 may include obtaining a silicon, metal, ceramic, polymer glass composite or polymersubstrate.

Stage 530 is executed after stage 520, and it includes deposing a plurality of material layers onto the substrate, thereby generating the microelectromechanical system which includes a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface; wherein the insulating separating member includes a first contact area which connects with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a minimal separation maintained by the insulating separating member between the first element and the second element.

Stage 530 may include, for example, processing sub-stages which fall into four general categories: deposition, removal, patterning, bonding, laminating and modification of electrical properties.

In the deposition sub-stages of stage 530, material is grown, coated, or otherwise transferred onto the wafer. Some technologies include physical vapor deposition (PVD), chemical vapor deposition (CVD), electrochemical deposition (ECD), molecular beam epitaxy (MBE) and atomic layer deposition (ALD) among others, as well as electrolytic or electroless plating, either selective through a mask (electroforming) or on the whole surface, spin coating, spraying, roller application.

In the removal sub-stages of stage 530, material is removed from the wafer either in bulk or selectively and includes, primarily, etch processes, either wet etching or dry etching. Chemical-mechanical planarization (CMP) is also a removal process used between levels. Removal by laser may also be used.

The patterning sub-stages of stage 530 include series of processes that shape or alter the existing shape of the deposited materials and is generally referred to as lithography.

The sub-stages of modification of electrical properties in stage 530 may include, for example, doping, reduction of dielectric constant in low-k insulating materials via exposure to ultraviolet light in UV processing (UVP), and so on.

It is noted that the insulating separating member (of members) fabricated in stage 530 are usually fabricated in different layers than those of the first element and the second element.

It is noted, stage 530 of deposing may be executed based on computer-assisted design (CAD) data. In such a case, the deposing may be preceded by stage 510 of generating at least a part of the CAD data. Many of the processes which are involved in the generating of the CAD data will present themselves to a person who is skilled in the art, and are not discussed in here for reasons of brevity. The following discussion focuses on stages which are especially useful in accordance with the presently disclosed subject matter. It is noted that parts of the CAD data may be obtained from an external source (or from results of previous computations), and the generating may include modifying the CAD data (by generating new data and/or modifying other data) in response to the computations of stage 510.

It is noted that the generating of the CAD data in stage 510 may include (or be preceded by) simulating geometry, material and electric fields for the MEMS, and utilizing results of the simulation for obtaining design parameters of the insulating separating member (or members).

Stage 510 may include stage 511 of estimating an estimated runtime electrical field in a vicinity of the separating member, and stage 512 of computing design dimensions of the insulating separating member in response to the estimated runtime electrical field and to an estimated electrical breakdown voltage in the vicinity of the separating member.

Optionally, method 500 may include (e.g. as part of the computing of stage 512) may include: (a) based on design data for the first element and for the second element, determining minimal required distance along a design reference plane between projections of a first designed contact area and of a second designed contact area in response to the estimated electrical breakdown voltage in the vicinity of the separating member; so that the estimated runtime electrical field would be smaller than the estimated electrical breakdown voltage; (b) obtaining manufacturing accuracy estimation for the fabrication of the microelectromechanical system, (c) determining a minimal post-manufacturing distance in response to the minimal required distance and to the manufacturing accuracy estimation; and (d) computing design dimensions for the first contact area and for the second contact area based on the minimal post-manufacturing distance.

Any of the computing stages may include simulation, and especially the stage of determining the minimal required distance, and also may include simulating the electric behavior based on CAD data (e.g. as exemplified in FIGS. 3A, 3B and 3C).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

What is claimed is:

1. A microelectromechanical system, comprising:
a first element and a second element, the first element having a first conductive surface facing a second conductive surface of the second element; wherein at least one of the first element and the second element is operable to constrainedly move nearer and farther from the other element; and
at least one insulating separating member which is operable to mechanically maintain a separation between the first surface and the second surface, wherein:
the insulating separating member comprises a first contact area which couples with the first surface and a second contact area which contacts with the second surface at least when the first element and the second element are nearest to one another;
wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane;
wherein a minimal distance between the first projection and the second projection is larger than a minimal separation maintained by the insulating separating member between the first element and the second element.

2. The microelectromechanical system of claim 1, wherein along at least a portion of the circumference of the first contact area there is a notch between the insulating separating member and the first surface in which prevails an internal electric field whose intensity is at least two times larger than an intensity of an external electric field adjacent to the notch; wherein the minimal distance keeps the internal electric field below an electrical breakdown voltage of a medium which is included in the notch.

3. The microelectromechanical system of claim 1, wherein the first element is a planar member, wherein the second element is a moving member which is operable to constrainedly move nearer and farther from the planar member in response to a controlled temporal sequence of potential differences between the planar member and the moving member; wherein the controlled temporal sequence of potential differences is controlled by an external controller in response to a signal inputted to the controller.

4. The microelectromechanical system of claim 1, wherein the insulating separating member comprises a first separator part whose convex envelope is substantially prismatic, and a second separator part whose convex envelope is substantially prismatic, the first separator part and the second separator part combinedly comprising at least 85% of a totality of insulating solid matter of the separating member;
wherein for each direction parallel to the reference plane, a first length is defined as a largest length of a cross section of the first separator part along the direction, and a second length is defined as a largest length of a cross section of the second separator part along the direction; wherein the larger of the first length and the second length is larger than the minimal separation maintained by the insulating separating member between the first element and the second element.

5. The microelectromechanical system of claim 1, wherein the insulating separating member is a unified separating member which comprises the first contact area and the second contact area; wherein the second contact area is operable to be separated from the second surface as a result of a relative movement of the second element farther from the first element.

6. The microelectromechanical system of claim 1, wherein the insulating separating member comprises: a first separator section which comprises the first contact area, and a second separator section which comprises the second contact area which couples the second separator section to the second surface; wherein the second separator section is operable to be separated from the first separator section as a result of a relative movement of the second element farther from the first element.

7. The microelectromechanical system of claim 6, wherein a hardness of the insulating separating member is larger than a hardness of the first element and of the second element, thereby serving as wear protection for the second element.

8. The microelectromechanical system of claim 6, wherein the first separator section is at least partially comprised in a recess in the first element so that no part of the first separator section extends outside the recess to a height which is larger than a third of a total height of the first separator section.

9. The microelectromechanical system of claim 8, wherein the first separator section is larger than the first separator section.

10. The microelectromechanical system of claim 1, comprising a separating member which comprises the insulating separating member and a part of the first element which extends from a surface plane of the first element towards the second conductive surface.

11. A microelectromechanical system, comprising:
a first element and a second element, the first element having a first conductive surface facing a second conductive surface of the second element; wherein at least one of the first element and the second element is operable to constrainedly move nearer and farther from the other element; and
at least one insulating separating member which is operable to mechanically maintain a separation between the first surface and the second surface, wherein:
the insulating separating member comprises a first contact area which couples with the first surface and a second contact area which contacts with the second surface at least when the first element and the second element are nearest to one another;

wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane;

wherein a minimal distance between the first projection and the second projection is larger than 0.2 μm.

12. The microelectromechanical system of claim 11, wherein the insulating separating member comprises: a first separator section which comprises the first contact area, and a second separator section which comprises the second contact area which couples the second part of the insulating separating member to the second surface; wherein the second separator section is operable to be separated from the first separator section as a result of a relative movement of the second element farther from the first element.

13. The microelectromechanical system of claim 12, wherein the first separator section is at least partially comprised in a recess in the first element so that no part of the first separator section extends outside the recess to a height which is larger than a third of a total height of the first separator section.

14. A microelectromechanical system, comprising:

a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface, wherein:

the insulating separating member comprises a first contact area which couples with the first surface and a second contact area which contacts with the second surface at least when the first element and the second element are nearest to one another;

wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane;

wherein a minimal distance between the first projection and the second projection is larger than a manufacturing accuracy of the separating member.

15. The microelectromechanical system according to claim 14, wherein the microelectromechanical system is fabricated as one out of a plurality of similar microelectromechanical systems on a batch of one or more wafers, each of the plurality of the similar microelectromechanical systems having an insulating separating member in a similar location with respect to the respective microelectromechanical system, the insulating separating member comprising a second contact area having a largest dimension; wherein the manufacturing accuracy is defined as a smallest threshold which is larger than 95% of the largest dimensions of the second contact areas.

16. The microelectromechanical system of claim 14, wherein the insulating separating member comprises: a first separator section which comprises the first contact area, and a second separator section which comprises the second contact area which couples the second part of the insulating separating member to the second surface; wherein the second separator section is operable to be separated from the first separator section as a result of a relative movement of the second element farther from the first element.

17. A method for fabrication of a microelectromechanical system, the method comprising:

obtaining a semiconductor substrate; and deposing a plurality of material layers onto the substrate, thereby generating the microelectromechanical system which comprises a first element and a second element, the first element having a first conductive surface facing a second conductive surface of the second element; wherein at least one of the first element and the second element is operable to constrainedly move nearer and farther from the other element; and at least one insulating separating member which is operable to mechanically maintain a separation between the first surface and the second surface; wherein the insulating separating member comprises a first contact area which couples with the first surface and a second contact area which contacts with the second surface at least when the first element and the second element are nearest to one another; wherein the first contact area defines a first projection which is a projection of a circumference of the first contact area on a reference plane which is substantially parallel to at least one of the first surface and the second surface, and the second contact area defines a second projection which is a projection of a circumference of the second contact area on the reference plane; wherein a minimal distance between the first projection and the second projection is larger than a minimal separation maintained by the insulating separating member between the first element and the second element.

18. The method according to claim 17, wherein the deposing is based on computer-assisted design (CAD) data, wherein the deposing is preceded by generating at least a part of the CAD data, wherein the generating comprises estimating an estimated runtime electrical field in a vicinity of the separating member, and computing design dimensions of the insulating separating member in response to the estimated runtime electrical field and to an estimated electrical breakdown voltage in the vicinity of the separating member.

19. The method according to claim 18, wherein the computing comprises:

based on design data for the first element and for the second element, determining minimal required distance along a design reference plane between projections of a first designed contact area and of a second designed contact area in response to the estimated electrical breakdown voltage in the vicinity of the separating member; so that the estimated runtime electrical field would be smaller than the estimated electrical breakdown voltage;

obtaining manufacturing accuracy estimation for the fabrication of the microelectromechanical system, determining a minimal post-manufacturing distance in response to the minimal required distance and to the manufacturing accuracy estimation; and computing design dimensions for the first contact area and for the first contact area based on the minimal post-manufacturing distance.

* * * * *